US012684849B2

(12) United States Patent
Lee et al.

(10) Patent No.: US 12,684,849 B2
(45) Date of Patent: Jul. 14, 2026

(54) SPECIALIZED TRANSISTORS

(71) Applicant: Taiwan Semiconductor Manufacturing Company, Ltd., Hsinchu (TW)

(72) Inventors: Tsung-Lin Lee, Hsinchu City (TW); Wei-Yang Lee, Taipei City (TW); Ming-Chang Wen, Kaohsiung City (TW); Chien-Tai Chan, Hsinchu City (TW); Chih Chieh Yeh, Taipei City (TW); Da-Wen Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 404 days.

(21) Appl. No.: 18/496,607

(22) Filed: Oct. 27, 2023

(65) Prior Publication Data

US 2025/0063791 A1 Feb. 20, 2025

Related U.S. Application Data

(60) Provisional application No. 63/520,299, filed on Aug. 17, 2023.

(51) Int. Cl.
H10D 64/01 (2025.01)
H10D 30/01 (2025.01)
(Continued)

(52) U.S. Cl.
CPC ......... H10D 64/017 (2025.01); H10D 30/014 (2025.01); H10D 30/43 (2025.01);
(Continued)

(58) Field of Classification Search
CPC .... H10D 64/017; H10D 30/014; H10D 30/43; H10D 30/6735; H10D 30/6757;
(Continued)

(56) References Cited

U.S. PATENT DOCUMENTS

| | | | |
|---|---|---|---|
| 11,195,937 B2 | 12/2021 | Liaw | |
| 11,430,892 B2 | 8/2022 | Chiang | |

(Continued)

FOREIGN PATENT DOCUMENTS

| | | | |
|---|---|---|---|
| KR | 20210095989 A | 8/2021 | |
| TW | 202147456 A | 12/2021 | |

(Continued)

*Primary Examiner* — Mark W Tornow
(74) *Attorney, Agent, or Firm* — HAYNES AND BOONE, LLP

(57) ABSTRACT

Semiconductor structures and methods of fabrication are provided. A method according to the present disclosure includes receiving a workpiece that includes an active region over a substrate and having first semiconductor layers interleaved by second semiconductor layers, and a dummy gate stack over a channel region of the active region, etching source/drain regions of the active region to form source/ drain trenches that expose sidewalls of the active region, selectively and partially etching second semiconductor layers to form inner spacer recesses, forming inner spacer features in the inner spacer recesses, forming channel extension features on exposed sidewalls of the first semiconductor layers, forming source/drain features over the source/drain trenches, removing the dummy gate stack, selectively removing the second semiconductor layers to form nanostructures in the channel region, and forming a gate structure to wrap around each of the nanostructures. The channel extension features include undoped silicon.

20 Claims, 35 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 84/01* | (2026.01) |
| *H10D 84/03* | (2025.01) |
| *H10D 84/83* | (2025.01) |

(52) U.S. Cl.
CPC ..... *H10D 30/6735* (2025.01); *H10D 30/6757* (2025.01); *H10D 62/121* (2025.01); *H10D 62/151* (2025.01); *H10D 64/018* (2025.01); *H10D 84/0128* (2025.01); *H10D 84/013* (2025.01); *H10D 84/0135* (2025.01); *H10D 84/0147* (2025.01); *H10D 84/038* (2025.01); *H10D 84/83* (2025.01)

(58) Field of Classification Search
CPC .. H10D 62/121; H10D 62/151; H10D 64/018; H10D 84/0128; H10D 84/013; H10D 84/0135; H10D 84/0147; H10D 84/038; H10D 84/83; H10D 84/0142; H10D 84/83138; H10D 84/8311; H10D 84/8316; H10D 30/797; H10D 30/019; H10D 30/0196; H10D 30/501; H10D 30/503; H10D 30/0193; H10D 62/822; H10D 64/015; H10D 64/021; H10D 30/031; H10D 84/0184; H10D 84/834; H10D 84/853
See application file for complete search history.

(56) References Cited

U.S. PATENT DOCUMENTS

| | | | | |
|---|---|---|---|---|
| 11,489,078 | B2 | 11/2022 | Lai | |
| 2020/0027959 | A1 | 1/2020 | Cheng | |
| 2020/0365692 | A1 | 11/2020 | Jung | |
| 2022/0093591 | A1 | 3/2022 | Chu | |
| 2022/0131014 | A1* | 4/2022 | Lai | H10D 30/6715 |
| 2022/0157969 | A1* | 5/2022 | Yin | H10D 30/6735 |
| 2022/0231172 | A1* | 7/2022 | Ha | H10D 30/6757 |
| 2023/0067804 | A1 | 3/2023 | Shen | |
| 2023/0369513 | A1* | 11/2023 | Min | H10D 64/017 |
| 2023/0378298 | A1* | 11/2023 | Li | H10D 64/018 |

FOREIGN PATENT DOCUMENTS

| | | | |
|---|---|---|---|
| TW | 202220210 | A | 5/2022 |
| TW | 202310194 | A | 3/2023 |

* cited by examiner

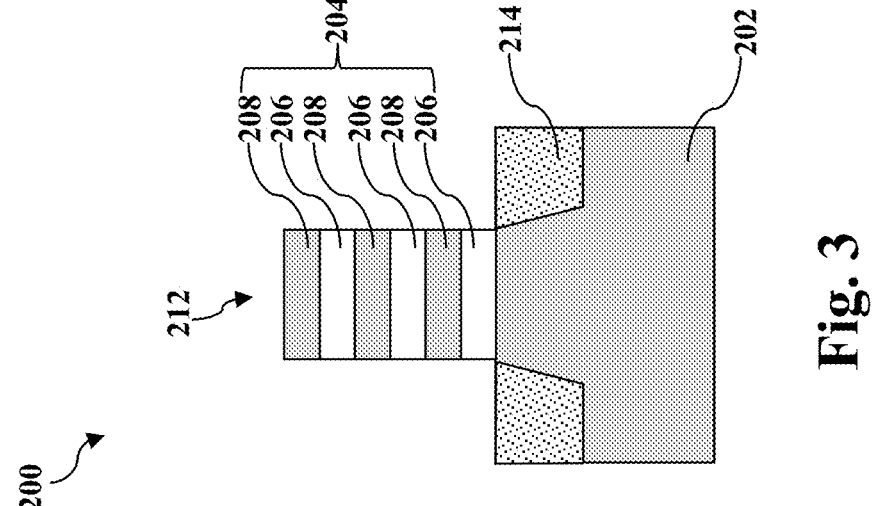
Fig. 3

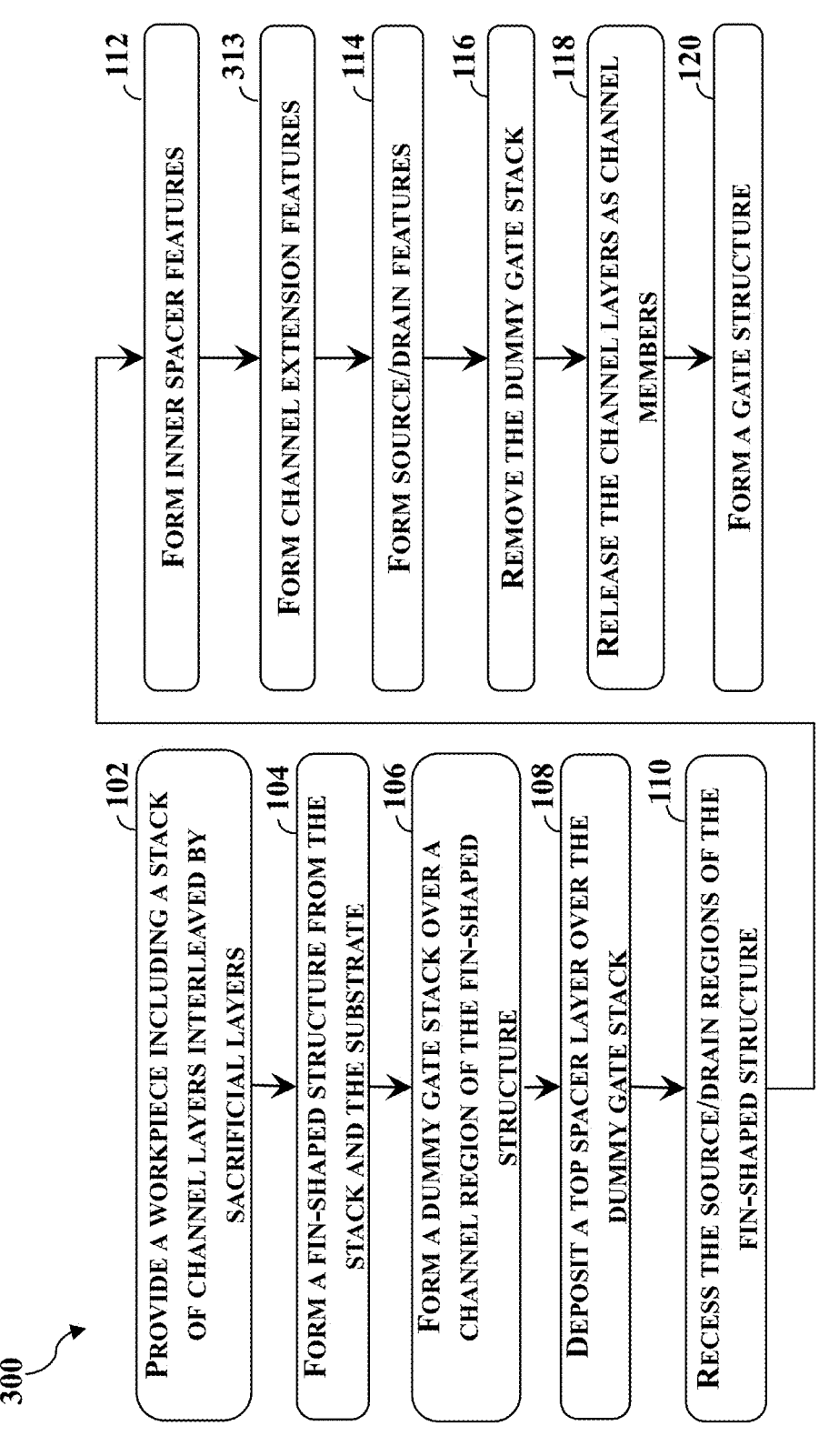

300

102 — PROVIDE A WORKPIECE INCLUDING A STACK OF CHANNEL LAYERS INTERLEAVED BY SACRIFICIAL LAYERS

104 — FORM A FIN-SHAPED STRUCTURE FROM THE STACK AND THE SUBSTRATE

106 — FORM A DUMMY GATE STACK OVER A CHANNEL REGION OF THE FIN-SHAPED STRUCTURE

108 — DEPOSIT A TOP SPACER LAYER OVER THE DUMMY GATE STACK

110 — RECESS THE SOURCE/DRAIN REGIONS OF THE FIN-SHAPED STRUCTURE

112 — FORM INNER SPACER FEATURES

313 — FORM CHANNEL EXTENSION FEATURES

114 — FORM SOURCE/DRAIN FEATURES

116 — REMOVE THE DUMMY GATE STACK

118 — RELEASE THE CHANNEL LAYERS AS CHANNEL MEMBERS

120 — FORM A GATE STRUCTURE

Fig. 17

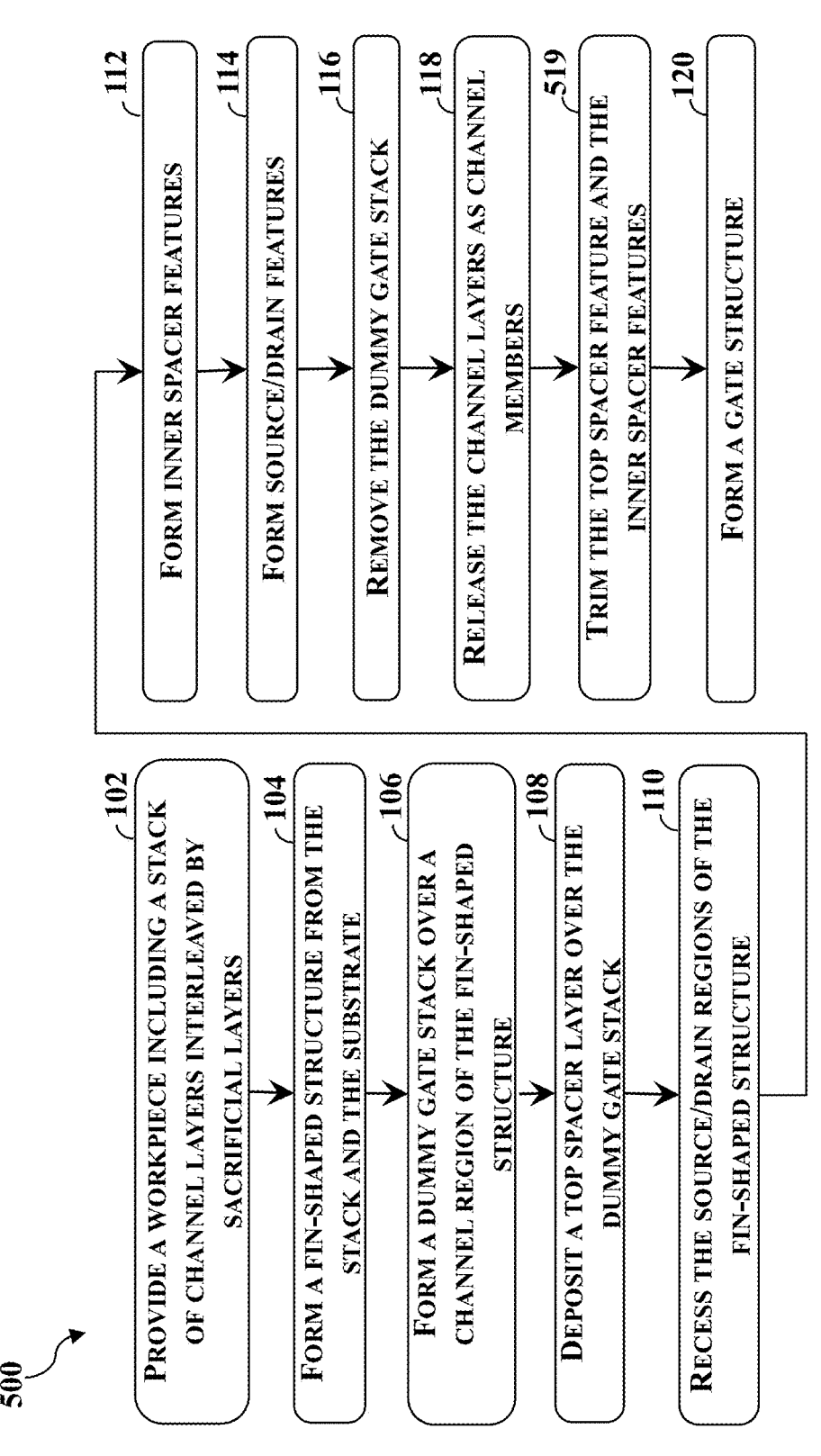

500

PROVIDE A WORKPIECE INCLUDING A STACK OF CHANNEL LAYERS INTERLEAVED BY SACRIFICIAL LAYERS — 102

FORM A FIN-SHAPED STRUCTURE FROM THE STACK AND THE SUBSTRATE — 104

FORM A DUMMY GATE STACK OVER A CHANNEL REGION OF THE FIN-SHAPED STRUCTURE — 106

DEPOSIT A TOP SPACER LAYER OVER THE DUMMY GATE STACK — 108

RECESS THE SOURCE/DRAIN REGIONS OF THE FIN-SHAPED STRUCTURE — 110

FORM INNER SPACER FEATURES — 112

FORM SOURCE/DRAIN FEATURES — 114

REMOVE THE DUMMY GATE STACK — 116

RELEASE THE CHANNEL LAYERS AS CHANNEL MEMBERS — 118

TRIM THE TOP SPACER FEATURE AND THE INNER SPACER FEATURES — 519

FORM A GATE STRUCTURE — 120

SPECIALIZED TRANSISTORS

PRIORITY DATA

This application claims priority to U.S. Provisional Patent Application Ser. No. 63/520,299, filed Aug. 17, 2023, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high performance and low leakage applications. A GAA transistor has a gate structure that can extend, partially or fully, around a channel region to provide access to the channel region on two or more sides. Because its gate structure surrounds the channel regions, a GAA transistor may also be referred to as a surrounding gate transistor (SGT). Because the channel region of an GAA transistor may include nanowires or nanosheets and its configuration resembles a bridge, a GAA transistor may also be referred to a multi-bridge-channel (MBC) transistor, a nanowire transistor, or a nanosheet transistor. The nanosheets and nanowires may be generally referred to as nanostructures.

GAA transistors may perform different functions in an IC device. Some functions may be best performed by transistors with low resistance and some may be best performed by transistors with low capacitance. While fabricating a single kind of GAA transistors to perform all functions saves cost, performance or energy efficiency of the IC device may be sacrificed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-14 illustrate fragmentary cross-sectional views of a workpiece during a fabrication process according to the method of FIG. 1, according to one or more aspects of the present disclosure.

FIGS. 15-16 illustrates schematic cross-sectional views of a workpiece having one area masked off for differential treatments to another area, according to one or more aspects of the present disclosure.

FIG. 17 illustrates a flowchart of a method for forming a semiconductor device with an extended channel length, according to one or more aspects of the present disclosure.

FIG. 30 illustrates a flowchart of a method for forming a semiconductor device with an extended gate length, according to one or more aspects of the present disclosure.

DETAILED DESCRIPTION

Figure 1:
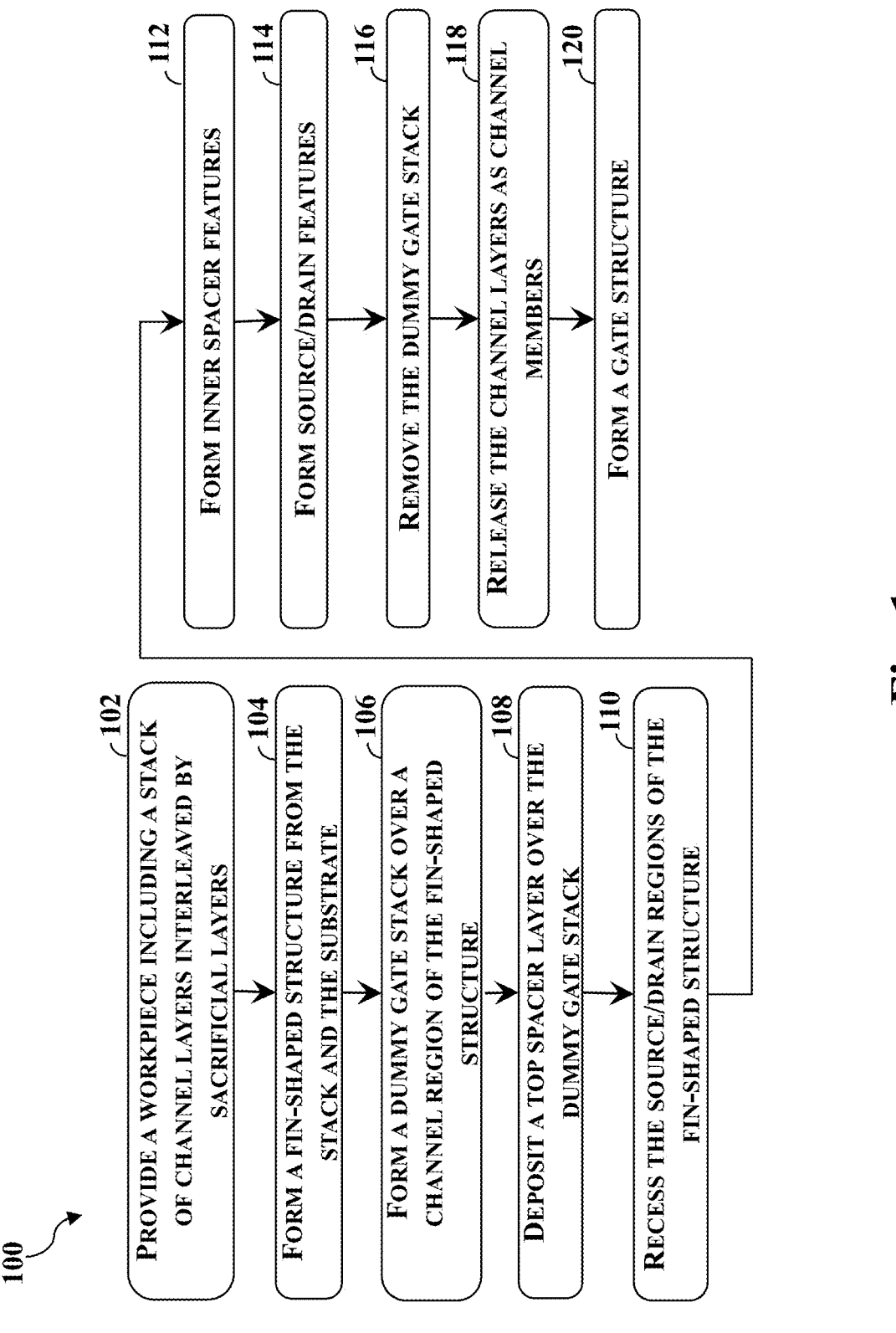
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. When two values are described as being the same, it should be understood that these two values are less than 10% different from one another such that they are substantially the same. As used herein, source/drain region(s) may refer to a source or a drain, individually or collectively, dependent upon the context.

Transistors in an IC device may be commissioned to serve different functions. Additionally, IC devices for different applications may call for transistors of different attributes. For example, when it comes to mobile applications that require long stand-by time, it is desirable for the transistors to have low capacitance. When high power or high performance transistors are desired, having low resistance may be the more beneficial than having low capacitance. Depending on whether a memory device is embedded or external, it may require either low resistance or low capacitance. A straightforward solution would be to fabricate a low-resistance and low-capacitance device to suit all design needs. However, it can be challenging to achieve low resistance and low capacitance simultaneously.

The present disclosure provides example processes to selectively manufacture GAA transistors of different attributes in different areas to meet different design needs. In a first embodiment, undoped silicon channel extension features may be deposited over end surfaces of the channel members. In a second embodiments, an overall thickness of top gate spacers may be increased or decreased to achieve different gate lengths. In a third embodiment, thicknesses of top gate spacer features and inner spacer features may be reduced after the release of the channel members in the channel region. GAA transistors according to different embodiments may be fabricated on a single substrate to perform different circuit functions.

The various aspects of the present disclosure will now be described in more detail with reference to the figures. In that regard, FIGS. 1, 17, 22, and 30 are flowcharts illustrating methods 100, 300, 400, or 500 of forming a semiconductor device from a workpiece according to embodiments of the present disclosure. Method 100, 300, 400, or 500 is merely an example and is not intended to limit the present disclosure to what is explicitly illustrated in method 100, 300, 400, or 500. Additional steps can be provided before, during and after each of the method 100, 300, 400, or 500, and some steps described can be replaced, eliminated, or moved around for additional embodiments of the method. Not all steps are described herein in detail for reasons of simplicity. Method 100 is described below in conjunction with FIG. 2-14, which are fragmentary cross-sectional views of workpiece 200 at different stages of fabrication according to embodiments of the method 100 in FIG. 1. Method 300 is described below in conjunction with FIGS. 2-10 and 18-21, which are fragmentary cross-sectional views of workpiece 200 at different stages of fabrication according to embodiments of the method 300 in FIG. 17. Method 400 is described below in conjunction with FIGS. 2-6 and 23-29, which are fragmentary cross-sectional views of workpiece 200 at different stages of fabrication according to embodiments of the method 400 in FIG. 22. Method 500 is described below in conjunction with FIGS. 2-13 and 31-33, which are fragmentary cross-sectional views of workpiece 200 at different stages of fabrication according to embodiments of the method 500 in FIG. 30. Because the workpiece 200 will be fabricated into a semiconductor device, the workpiece 200 may be referred to herein as a semiconductor device 200 as the context requires. For avoidance, the X, Y and Z directions in FIGS. 2-16, 18-21, 23-29, and 31-33 are perpendicular to one another. Additionally, throughout the disclosure, like reference numerals may denote like features.

Figure 2:
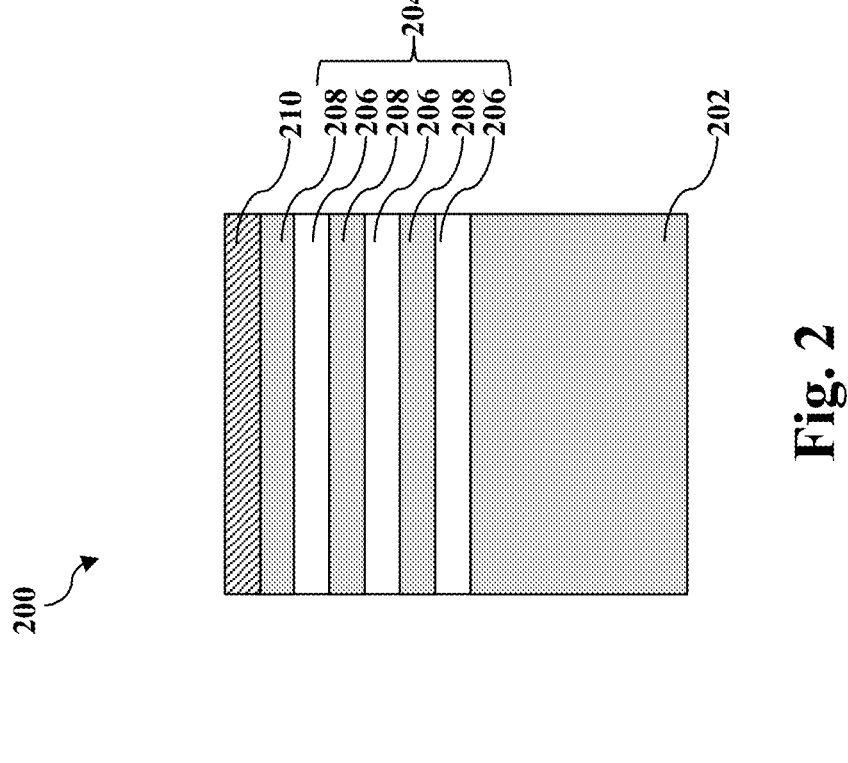

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenic (As). In embodiments where the semiconductor device is n-type, a p-type doping profile (i.e., a p-type well or p-well) may be formed on the substrate 202. In some implementations, the n-type dopant for forming the p-type well may include boron (B) or gallium (Ga). The suitable doping may be performed using ion implantation of dopants and/or diffusion processes. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. The first and second semiconductor composition may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness and all of the channel layers 208 may have a substantially uniform second thickness. The first thickness and the second thickness may be the same or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance (along the Z direction) between adjacent channel region(s) for a subsequently-formed multi-gate device and the thickness of each of the sacrificial layers 206 is chosen based on device performance considerations.

The layers in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 cm$^{-3}$ to about $1\times10^{17}$ cm$^{-3}$), where for example, no intentional doping is performed during the epitaxial growth processes for the stack 204.

Referring still to FIGS. 1, 2 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212, along with the sacrificial layers 206 and the channel layers 208 therein, extends vertically along the Z direction and lengthwise along the X direction.

An isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing.

Figure 4:
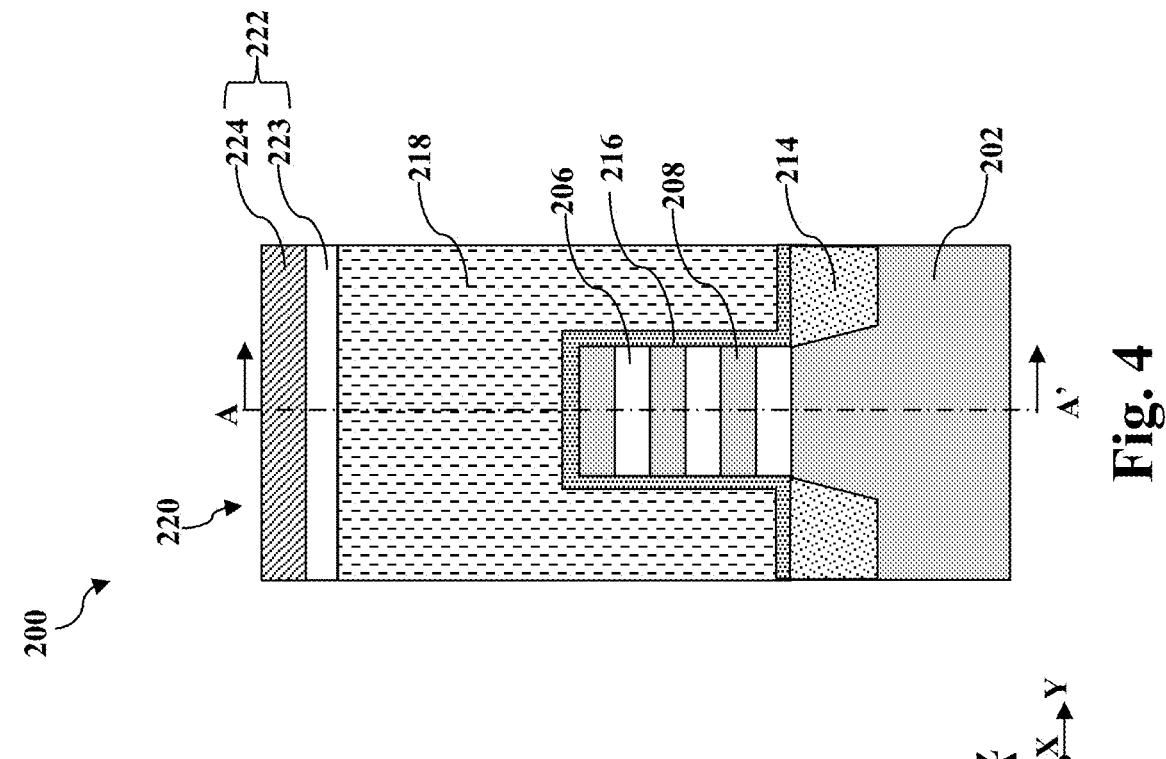
Figure 5:
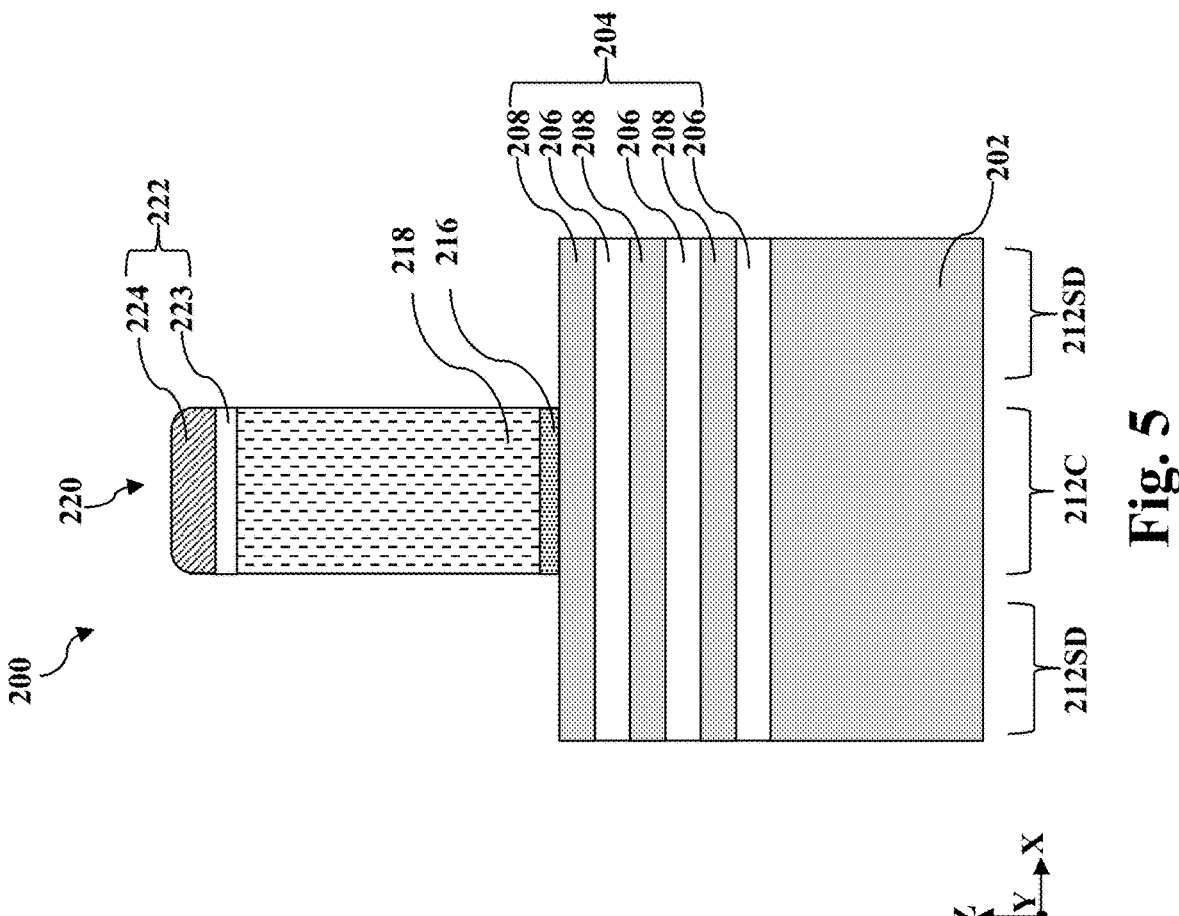

Referring to FIGS. 1, 4 and 5, method 100 includes a block 106 where a dummy gate stack 220 is formed over a channel region 212C of the fin-shaped structure 212. In some embodiments, a gate replacement process (or gate-last process) is adopted where the dummy gate stack 220 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 212 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon (Poly-Si). For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIGS. 4 and 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, no dummy gate stack 220 is disposed over the source/drain region 212SD of the fin-shaped structure 212.

Figure 6:
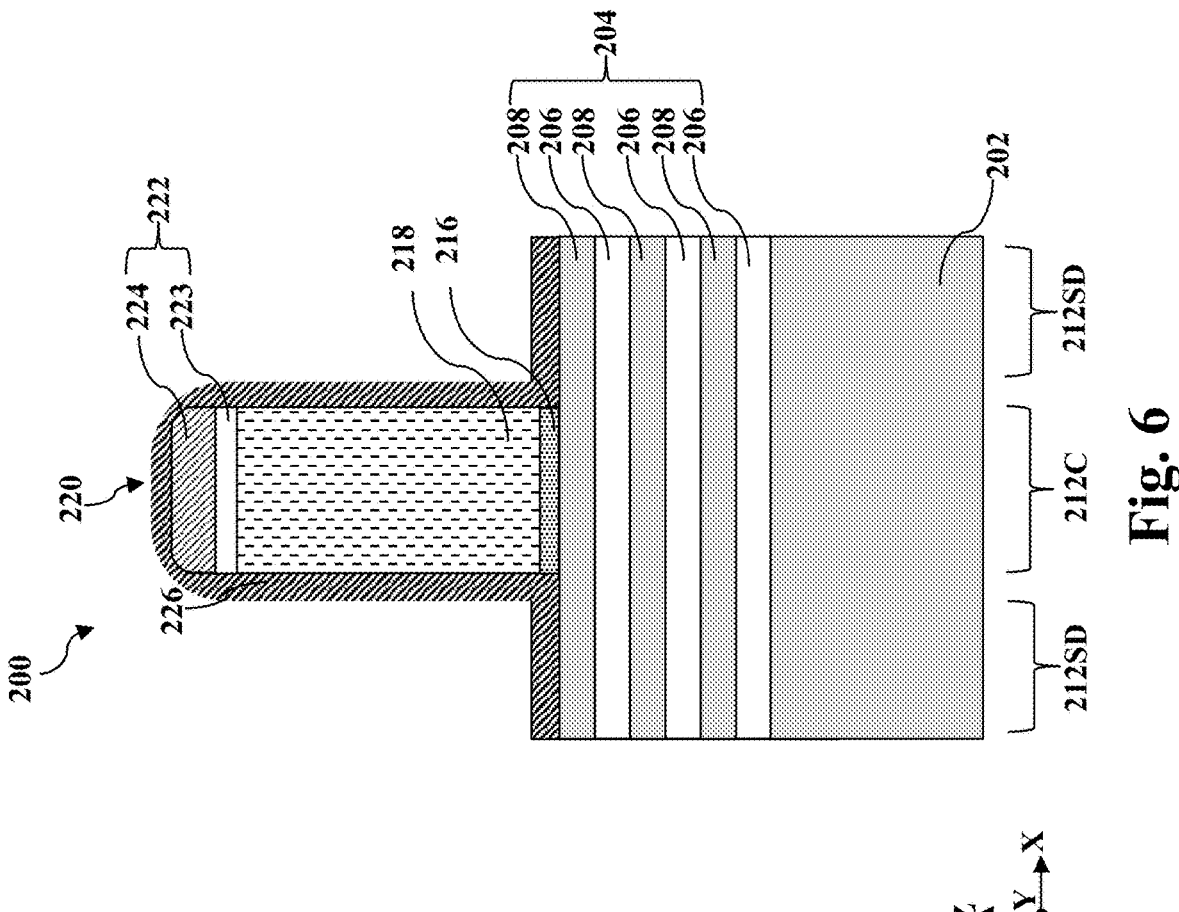

Referring to FIGS. 1 and 6, method 100 includes a block 108 where a top spacer layer 226 is deposited over the dummy gate stack 220. In some embodiments, the top spacer layer 226 is deposited conformally over the workpiece 200, including over top surfaces and sidewalls of the dummy gate stack 220. The term "conformally" may be used herein for ease of description of a layer having substantially uniform thickness over various regions. The top spacer layer 226 may be a single layer or a multi-layer. The top spacer layer 226 may include silicon carbonitride, silicon oxycarbide, silicon oxycarbonitride, or silicon nitride. In some implementations, the top spacer layer 226 may be deposited over the dummy gate stack 220 using processes such as, a CVD process, a subatmospheric CVD (SACVD) process, an ALD process, or other suitable process.

Figure 7:
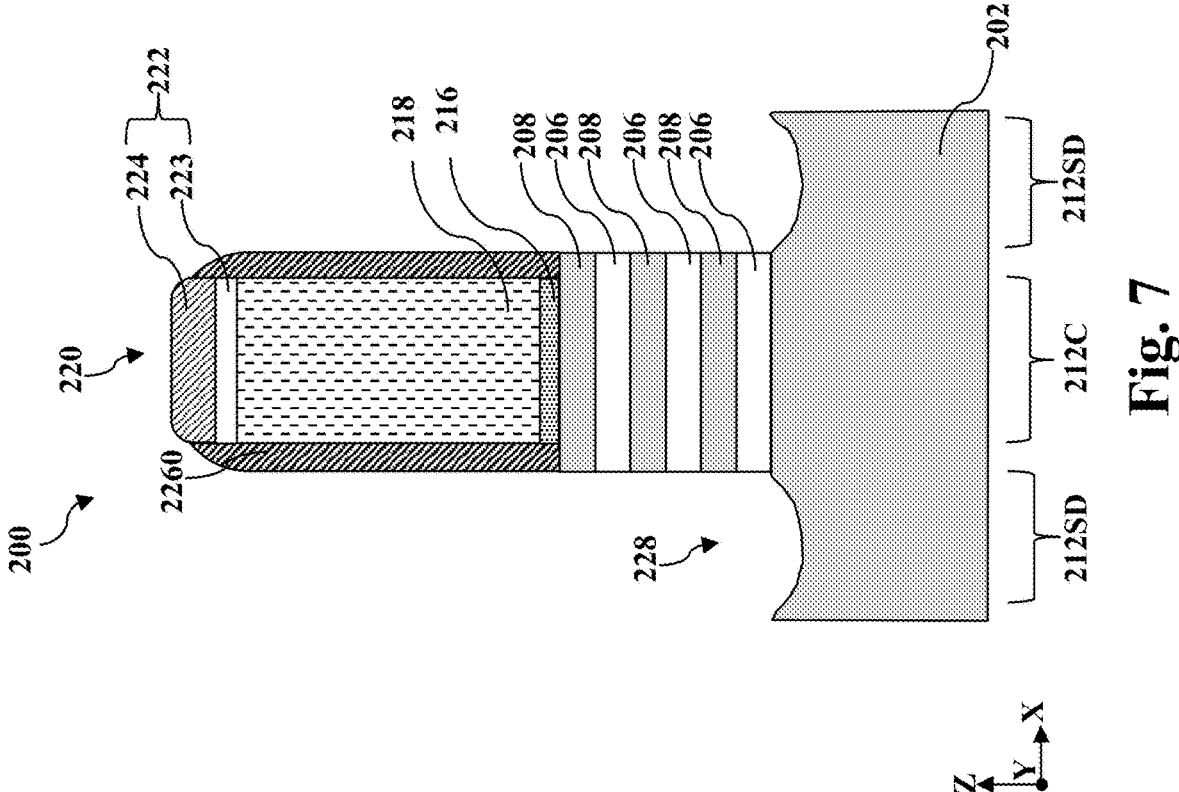

Referring to FIGS. 1 and 7, method 100 includes a block 110 where a source/drain region 212SD of the fin-shaped structure 212 is recessed to form a source/drain trench 228. As shown in FIG. 7, the recessing at block 110 may remove the top facing portion of the top spacer layer 226 to form a top spacer 2260 disposed along sidewalls of the dummy gate stack 220. In some embodiments, the source/drain regions 212SD that are not covered by the dummy gate stack 220 are etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIG. 7, the source/drain regions 212SD of the fin-shaped structure 212 are recessed to expose sidewalls of the sacrificial layers 206 and the channel layers 208. In some implementations, the source/drain trenches 228 extend below the stack 204 into the substrate 202. As shown in FIG. 7, the sacrificial layers 206 and channel layers 208 in the source/drain region 212SD are removed at block 110, exposing the substrate 202 and sidewalls of the sacrificial layers 206 and channel layers 208.

Figure 8:
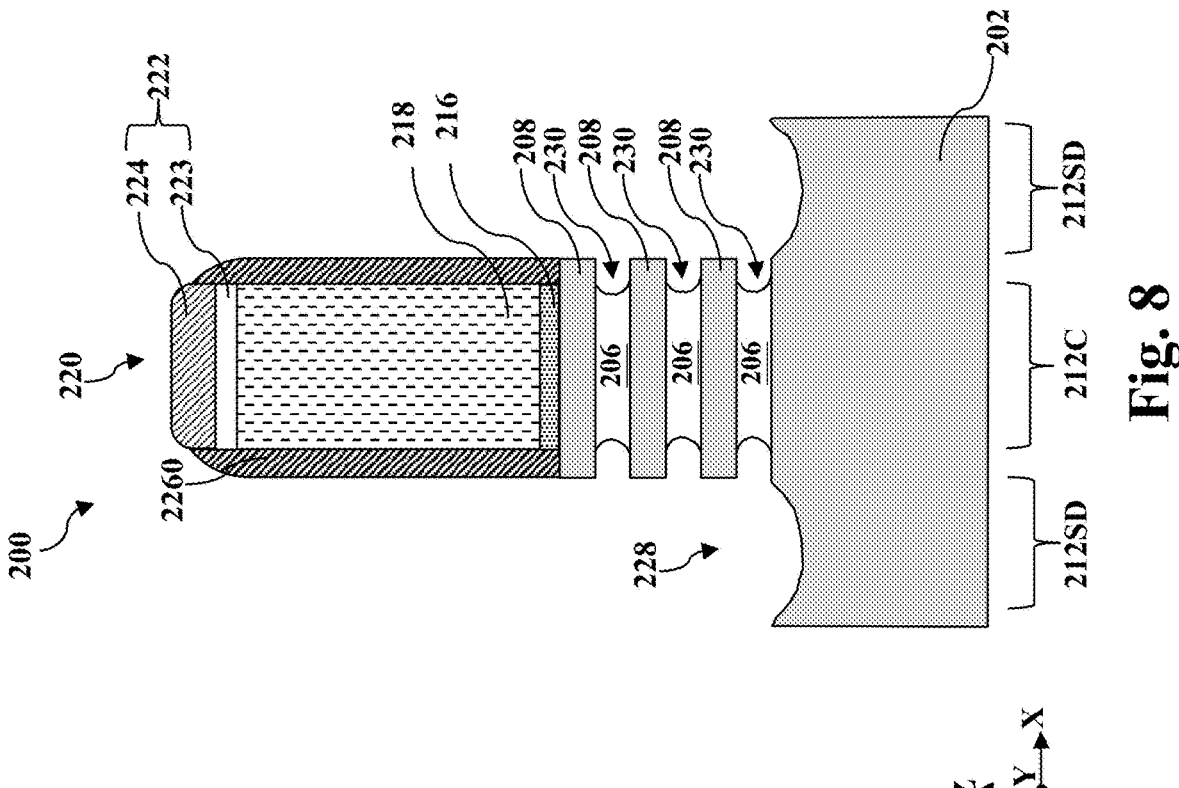
Figure 9:
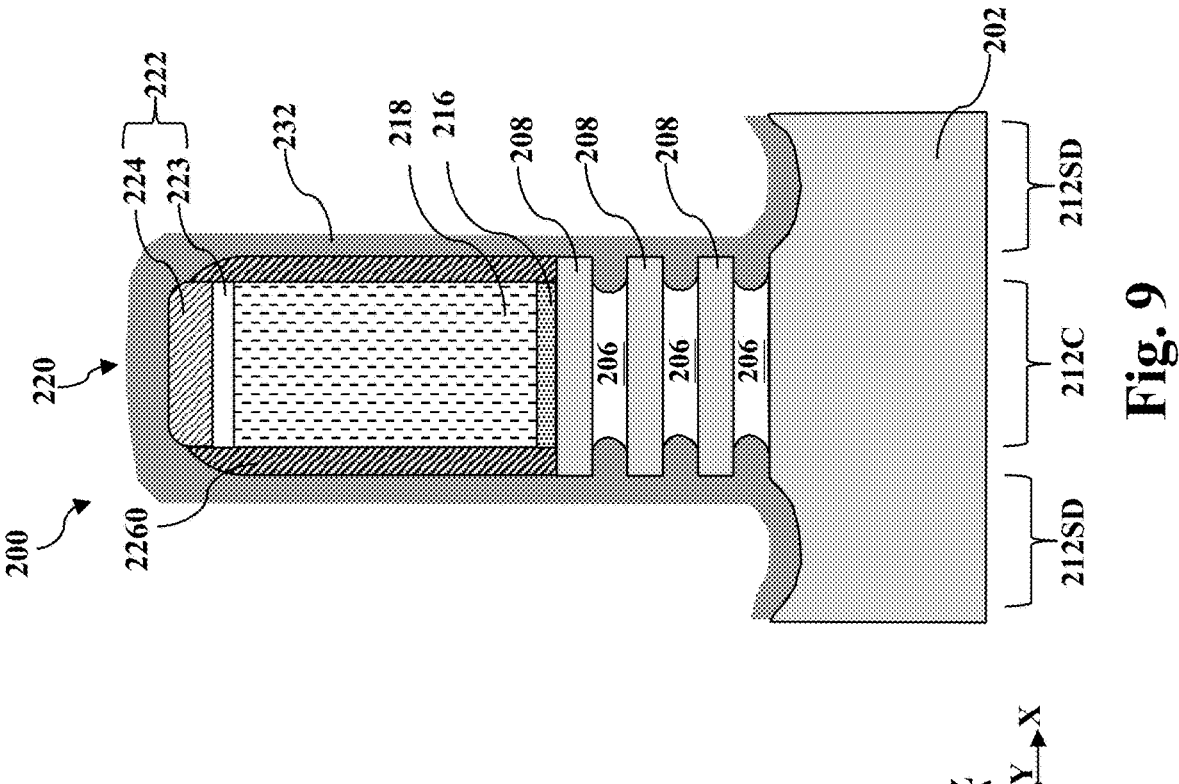
Figure 10:
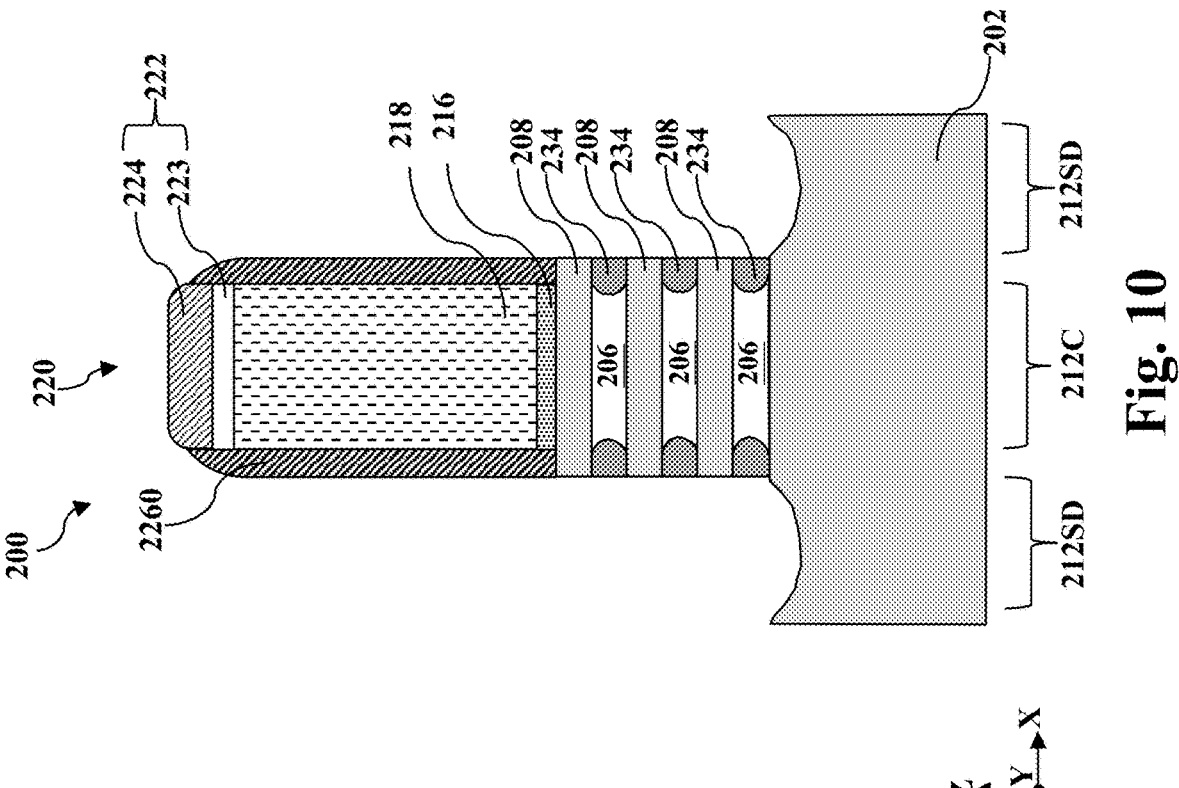

Referring to FIGS. 1, 8, 9, and 10, method 100 includes a block 112 where inner spacer features 234 are formed. While not shown explicitly, operation at block 112 may include selective and partial removal of the sacrificial layers 206 to form inner spacer recesses 230 (shown in FIG. 8), deposition of inner spacer material 232 over the workpiece 200 (shown in FIG. 9), and etch back the inner spacer material 232 to form inner spacer features 234 in the inner spacer recesses 230 (FIG. 10). Reference is made to FIG. 8. The sacrificial layers 206 exposed in the source/drain trenches 228 are selectively and partially recessed to form inner spacer recesses 230 while the top spacer 2260, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. The selective and partial recess of the sacrificial layers 206 may include a SiGe oxidation process followed by a SiGe oxide removal. In that embodiments, the SiGe oxidation process may include use of ozone. In some other embodiments, the selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

Referring to FIG. 9, after the inner spacer recesses 230 are formed, the inner spacer material 232 is deposited over the workpiece 200, including over the inner spacer recesses 230. The inner spacer material 232 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material 232 may be a single layer or a multilayer. In some implementations, the inner spacer material 232 may be deposited using CVD, PECVD, SACVD, ALD or other suitable methods. The inner spacer material 232 is deposited into the inner spacer recesses 230 as well as over the sidewalls of the channel layers 208 exposed in the source/drain trenches 228. Referring to FIG. 10, the deposited inner spacer material 232 is then etched back to remove the inner spacer material 232 from the sidewalls of the channel layers 208 to form the inner spacer features 234 in the inner spacer recesses 230. At block 112, the inner spacer material 232 may also be removed from the top surfaces and/or sidewalls of the gate-top hard mask layer 222 and the top spacer 2260. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 10, each of the inner spacer features 234 is in direct contact with the recessed sacrificial layers 206 and is disposed between two neighboring channel layers 208. That is, the inner spacer features 234 interleave the channel layers 208.

Figure 11:
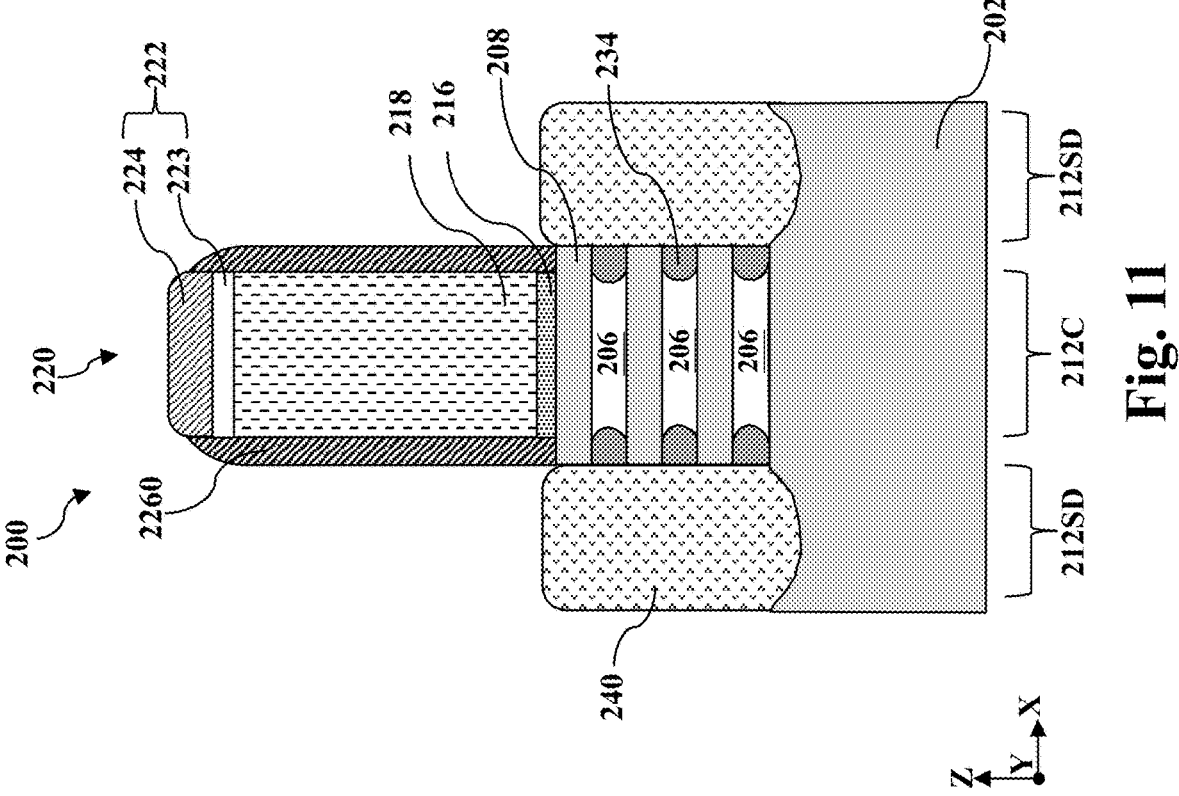

Referring to FIGS. 1 and 11, method 100 includes a block 114 where source/drain features 240 are formed. In some implementations represented in FIG. 11, the source/drain features 240 may be epitaxially and selectively formed from the exposed sidewalls of the channel layers 208 and exposed portions of the substrate 202 while sidewalls of the sacrificial layers 206 remain covered by the inner spacer features 234. Suitable epitaxial processes for block 114 include vapor-phase epitaxy (VPE), ultra-high vacuum CVD (UHV-CVD), molecular beam epitaxy (MBE), and/or other suitable processes. The epitaxial growth process at block 114 may use gaseous precursors, which interact the channel layers 208 and the substrate 202. In some embodiments, parameters of the epitaxial growth process at block 114 are selected such that the source/drain features 240 are not epitaxially deposited on the inner spacer features 234. It is noted, while each of the source/drain features 240 is illustrated in FIG. 11 as having a uniform continuous structure, it may include multiple epitaxial layers with different dopant concentration or germanium (Ge) content (if germanium (Ge) is desired). Depending on the design, the source/drain features 240 may be n-type or p-type. When the source/drain features 240 are n-type, they may include silicon (Si) and at least one n-type dopant (e.g., phosphorus (P)). When the source/drain features 240 are p-type, they may include silicon germanium (SiGe) and at least one p-type dopant (e.g., boron (B)). In an example where the source/drain feature 240 includes a first epitaxial layer adjacent the channel layers 208 and the substrate 202, a second epitaxial layer over the first epitaxial layer, and a third epitaxial layer over the second epitaxial layer, the second epitaxial layer may have a dopant concentration greater than that of the first epitaxial layer or the third epitaxial layer. In this example, when the source/drain feature 240 is p-type, a germanium content in the first epitaxial layer may be lower than that in the second epitaxial layer or the third epitaxial layer.

In some implementation, an anneal process may be performed to anneal the source/drain features 240. The anneal process may include a rapid thermal anneal (RTA) process, a laser spike anneal process, a flash anneal process, or a furnace anneal process. In some instances, the anneal process may include a peak anneal temperature between about 900° C. and about 1000° C. In these implementations, the peak anneal temperature may be maintained for a duration measured by seconds or microseconds. Throughout the anneal process, a desired electronic contribution of the dopant (such as p-type dopant boron (B) or n-type dopant phosphorus (P)) in the semiconductor host, such as silicon (Si) or silicon germanium (SiGe), may be obtained. The anneal process may generate vacancies that facilitate movement of the p-type dopant from interstitial sites to substitutional lattice sites and reduce damages or defects in the lattice of the semiconductor host.

Figure 12:
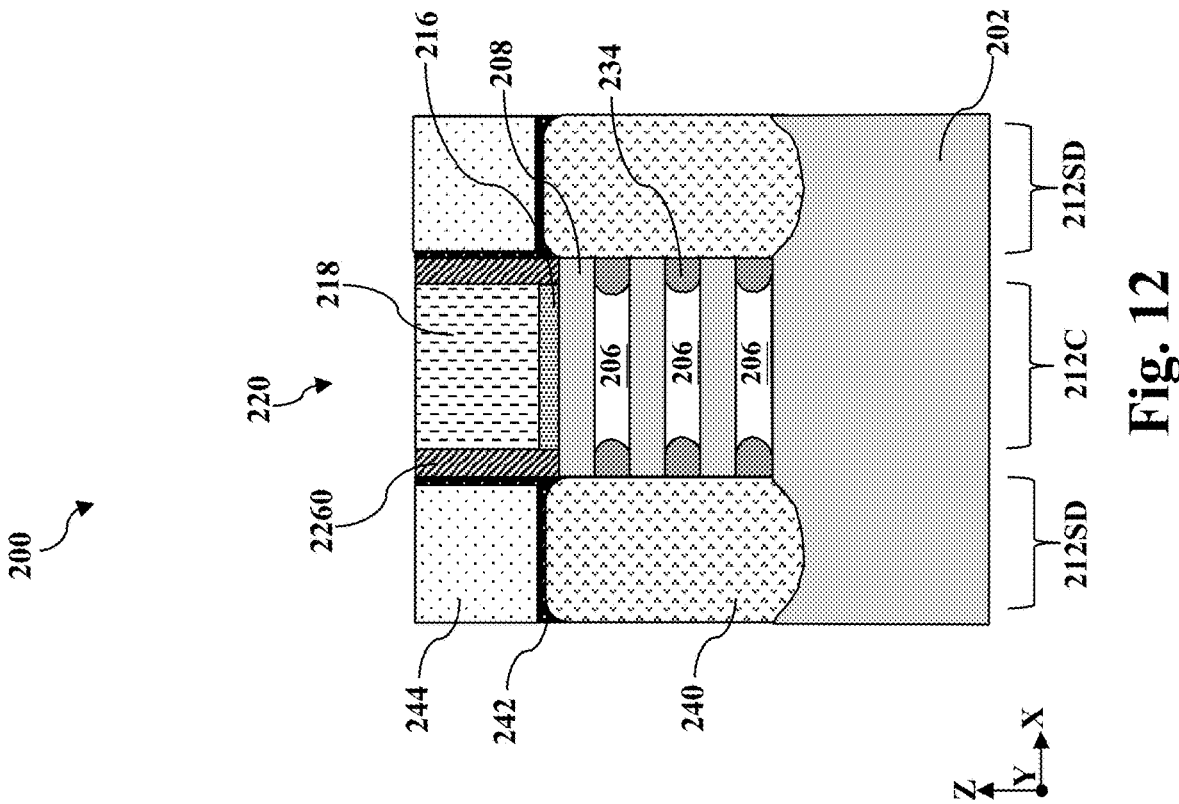
Figure 13:
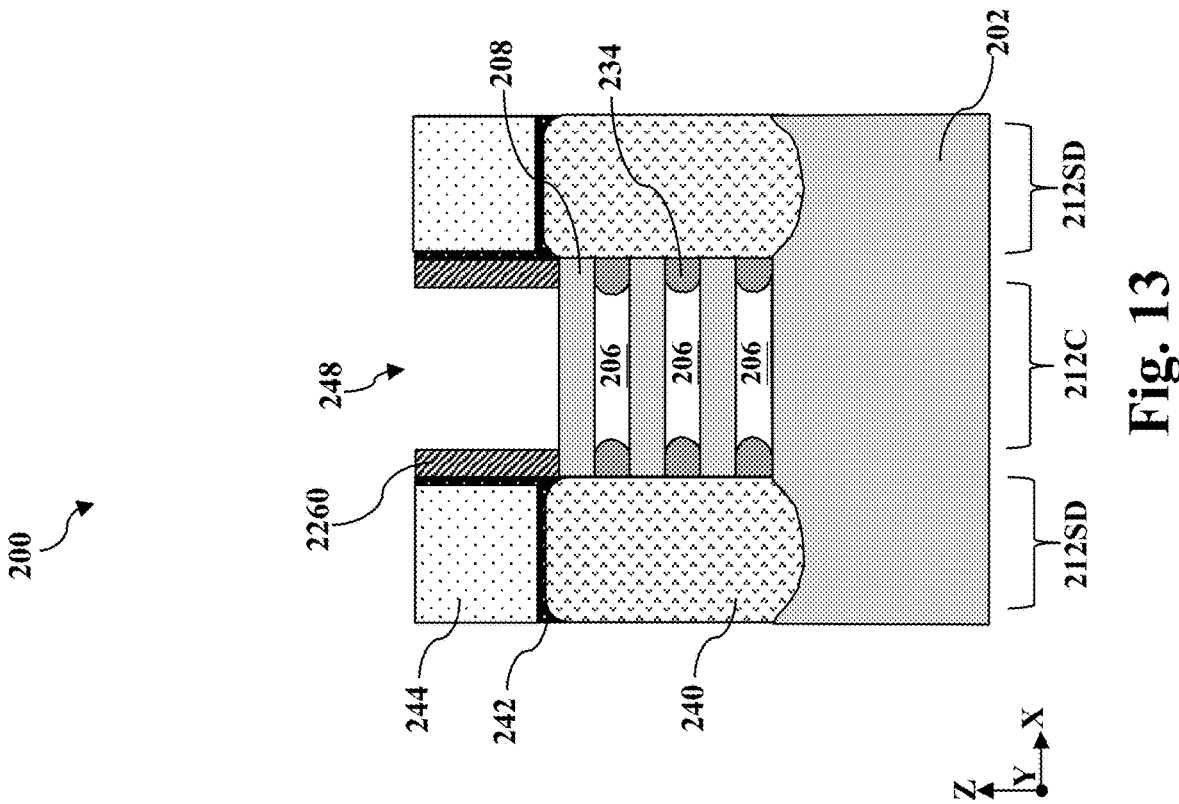

Referring to FIGS. 1, 12 and 13, method 100 includes a block 116 where the dummy gate stack 220 is removed. Operations at block 116 may include deposition of a contact etch stop layer (CESL) 242 over the workpiece 200 (shown in FIG. 12), deposition of an interlayer dielectric (ILD) layer 244 over the CESL 242 (shown in FIG. 12), and removal of the dummy gate stack 220 (shown in FIG. 13). Referring now to FIG. 12, the CESL 242 is deposited prior to deposition of the ILD layer 244. In some examples, the CESL 242 includes silicon nitride, silicon oxynitride, and/or other materials known in the art. The CESL 242 may be formed by ALD, plasma-enhanced chemical vapor deposition (PECVD) process and/or other suitable deposition processes. The ILD layer 244 is then deposited over the CESL 242. In some embodiments, the ILD layer 244 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by a PECVD process or other suitable deposition technique. In some embodiments, after formation of the ILD layer 244, the workpiece 200 may be annealed to improve integrity of the ILD layer 244. As shown in FIG. 12, the CESL 242 may be disposed directly on top surfaces of the source/drain features 240.

Referring still to FIG. 12, after the deposition of the CESL 242 and the ILD layer 244, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220, as illustrated in FIG. 13. In some embodiments, the removal of the dummy gate stack 220 results in a gate trench 248 over the channel regions 212C. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed in the gate trench 248.

Figure 14:
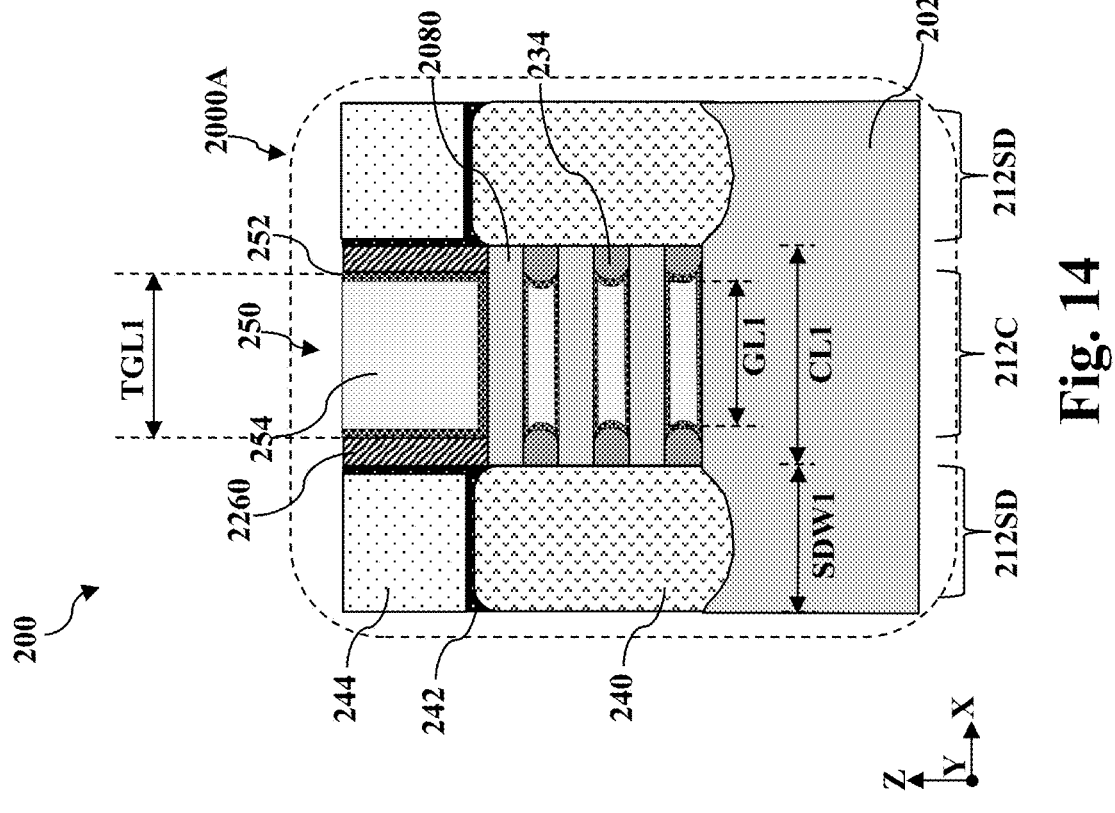

Referring to FIGS. 1 and 14, method 100 includes a block 118 where channel layers 208 are released as channel members 2080. Referring to FIG. 14, after the removal of the dummy gate stack 220 to form the gate trench 248, the method 100 selectively removes the sacrificial layers 206 between the channel layers 208 in the channel region 212C. The selective removal of the sacrificial layers 206 releases the channel layers 208 in FIG. 13 to form channel members 2080 in FIG. 14. The selective removal of the sacrificial layers 206 also leave behind space between channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Referring to FIGS. 1 and 14, method 100 includes a block 120 where a gate structure 250 is formed. At block 120, the gate structure 250 is formed within the gate trench 248 and into the space left behind by the removal of the sacrificial layers 206. The gate structure 250 includes a gate dielectric layer 252 and a gate electrode layer 254 over the gate dielectric layer 252. In some embodiments, while not explicitly shown in the figures, the gate dielectric layer 252 includes an interfacial layer disposed on the channel members 2080 and a high-K gate dielectric layer over the interfacial layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer 254 of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 254 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 254 may be formed by ALD, PVD, CVD, e-beam evaporation, or other suitable process. In various embodiments, a CMP process may be performed to remove excessive metal, thereby providing a substantially planar top surface of the gate structure 250. An upper portion of the gate structure 250 is sandwiched between a pair of top spacer features 2260 and a lower portion of the gate structure 250 is isolated from the source/drain features 240 by the plurality of inner spacer features 234.

Reference is again made to FIG. 14. Upon conclusion of method 100, a first transistor 2000A is formed. According to the present disclosure, more than one types of GAA transistors may be fabricated on a single substrate to have different characteristics suitable for different functions or applications. The first transistor 2000A includes a first top gate length TGL1 for an upper portion of the gate structure 250 over the channel members 2080, a first gate length GL1 for a lower portion of the gate structure 250 among the channel members 2080, a first channel length CL1, and a first source/drain feature width SDW1. The first transistor 2000A represents one type of GAA transistor and may be considered a reference device for other transistors formed using methods 300, 400, or 500.

Figure 15:
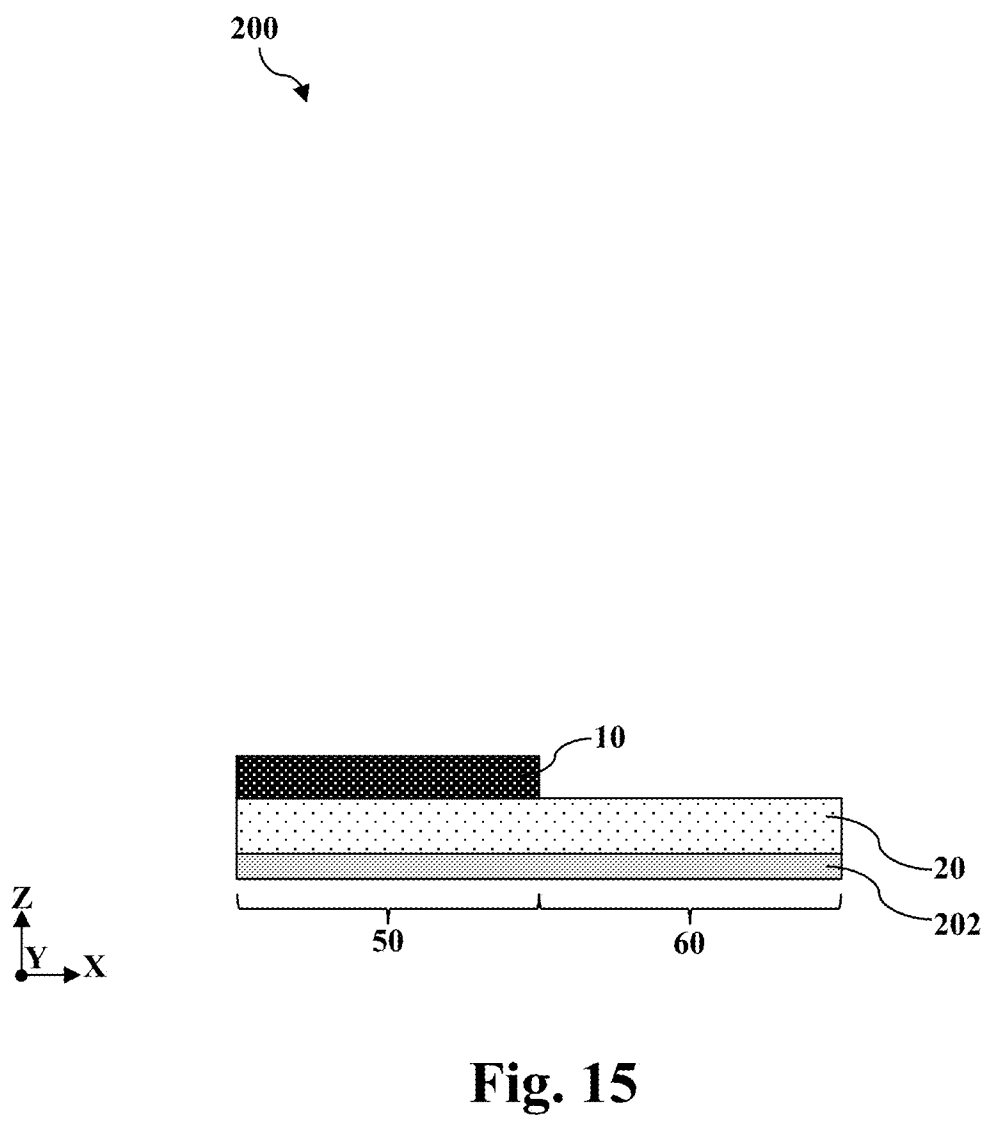
Figure 16:
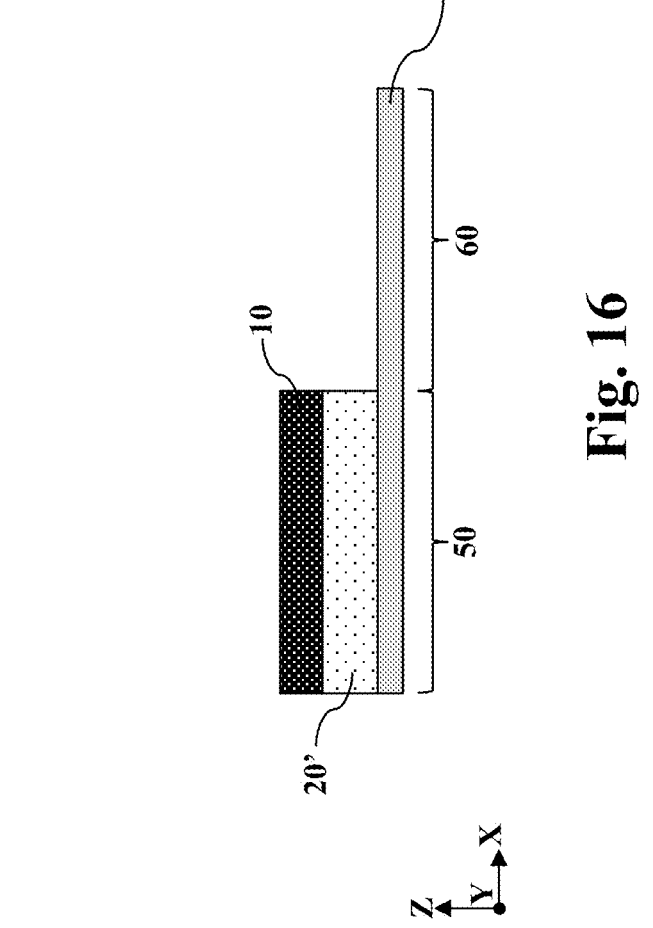

In order to form a specific type of GAA transistor in one area of a substrate, another area of the substrate is masked off with a patterned mask during at least part of the fabrication process. FIGS. 15 and 16 illustrate an example process to mask off a first area 50 of a substrate 202 while a second area 60 of the substrate 202 is exposed. Referring to FIG. 15, a mask layer 20 is first blankletly deposited over the first area 50 and the second area 60 of the substrate 202. In some embodiments, the mask layer 20 may include aluminum oxide or a dielectric material that may be selectively etched away without substantially etching dielectric materials such as silicon oxide or silicon nitride. The mask layer 20 may be deposited using CVD, low-pressure CVD (LPCVD), plasma-enhanced CVD (PECVD), or atmospheric pressure CVD (APCVD). After the blanket deposition of the mask layer 20, a photoresist layer 10 is deposited over the mask layer 20 using spin-on coating and is patterned using photolithography techniques. As shown in FIG. 16, with the patterned photoresist layer 10 serving as an etch mask, the mask layer 20 is etched to form a patterned mask layer 20' to cover the first area 50. Transistors in the first area 50 and transistors in the second area 60 may share some process steps. When the process starts to differ, a selective masking process representatively shown in FIGS. 15 and 16 may be performed.

Figure 21:
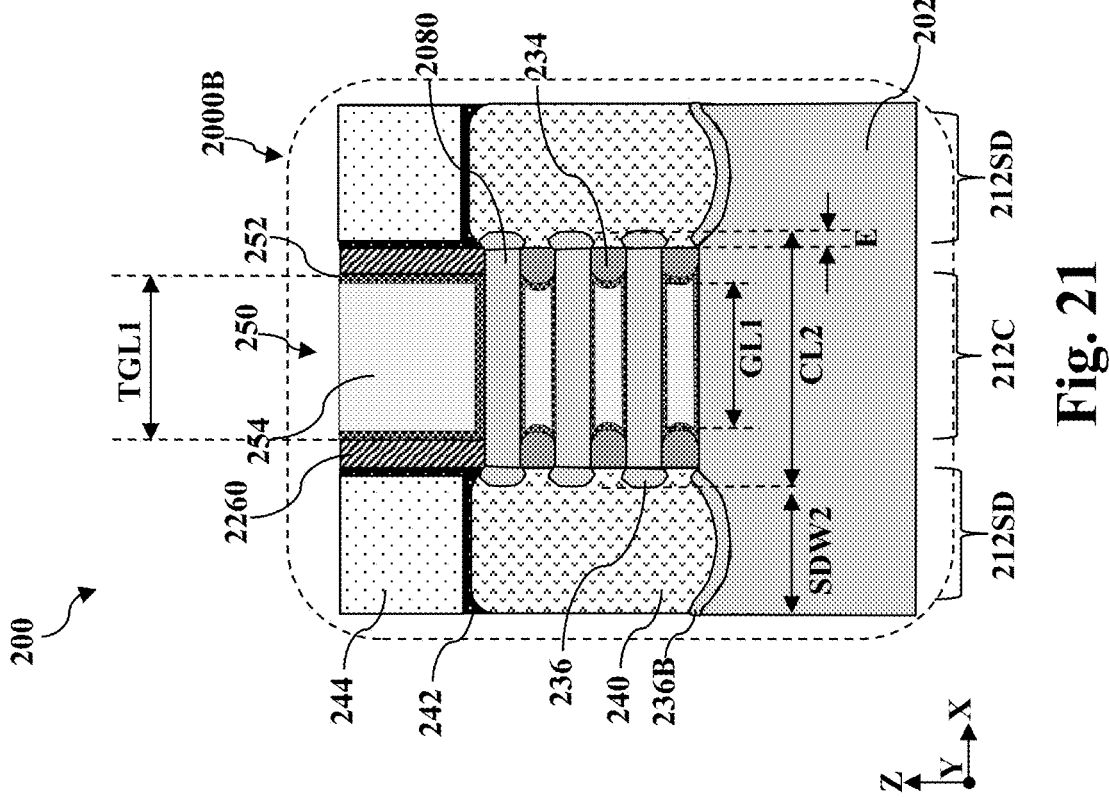

FIG. 17 illustrates a method 300 for forming a second transistor 2000B shown in FIG. 21. Compared to the first transistor 2000A shown in FIG. 14, the second transistor 2000B has extended channel lengths, which may lead to higher resistance, lower capacitance, and lower leakage current. As shown in FIGS. 1 and 17, method 300 shares operations in blocks 102-112 and 114-120 and further includes block 313.

Figure 18:
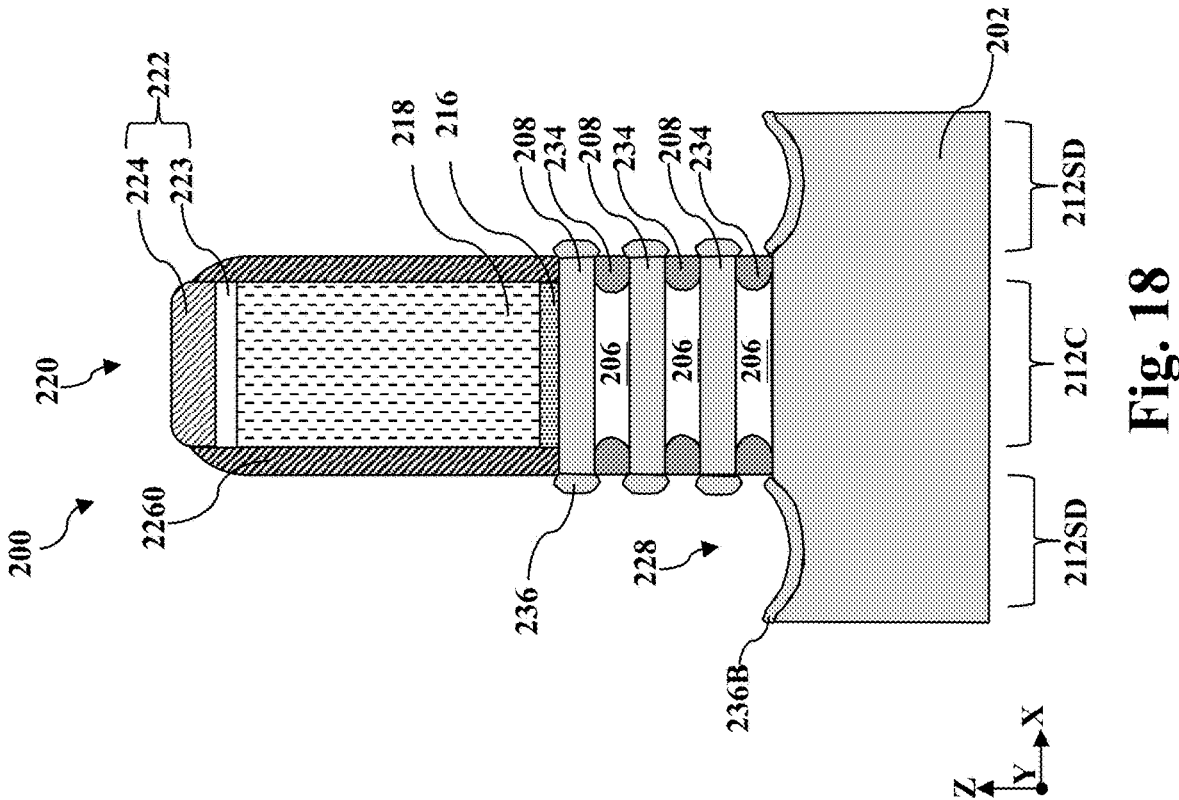
FIGS. 18-21 illustrate fragmentary cross-sectional views of a workpiece during a fabrication process according to the method of FIG. 17, according to one or more aspects of the present disclosure.

Referring to FIGS. 17 and 18, method 300 includes a block 313 where channel extension features 236 are formed. After the inner spacer features 234 are formed at block 112, channel extension features 236 may be selectively deposited on end sidewalls of the channel layers 208 and portions of the substrate 202 exposed in the source/drain trench 228. For ease of reference, the channel extension feature 236 over the substrate 202 may be referred to as bottom channel extension features 236B. In some embodiments, the channel extension features 236 may include undoped silicon (Si) and may be deposited using vapor-phase epitaxy (VPE), ultra-high vacuum CVD (UHV-CVD), molecular beam epitaxy (MBE), and/or other suitable processes. As used herein, undoped silicon (Si) is substantially dopant-free (i.e., having an extrinsic dopant concentration from about 0 $cm^{-3}$ to about $1 \times 10^{17}$ $cm^{-3}$), where for example, no intentional doping is performed during the epitaxial growth processes for channel extension features 236. Because the channel layers 208 are also formed of undoped silicon (Si), the channel extension features 236 effectively increase a length of the channel layers 208

Figure 19:
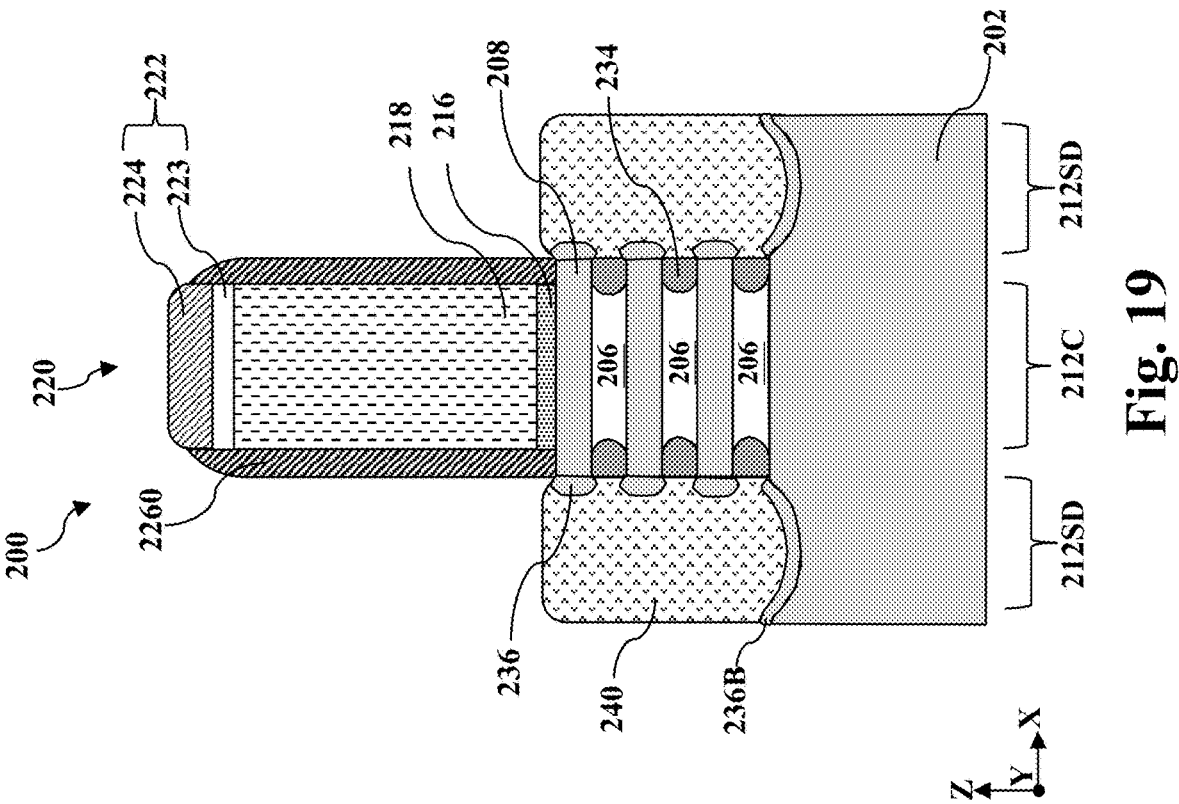
Figure 20:
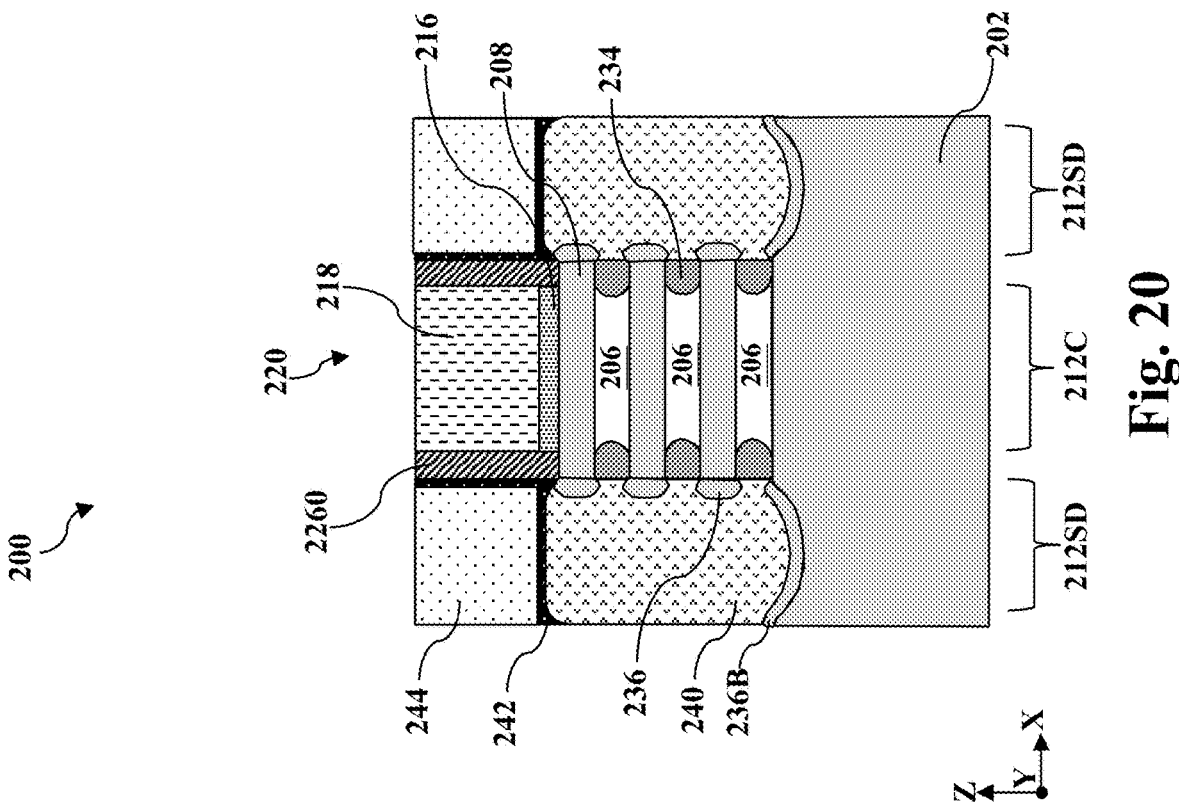

Referring to FIGS. 17 and 19, after the channel extension features 236 are formed, method 300 proceeds to block 114 where source/drain features 240 are formed. Additionally, the patterned hard mask that is used to selectively form channel extension features 236 in certain areas of the substrate 202 may be removed at this point such that operations at block 114 may be performed to all areas of the substrate 202. As shown in FIG. 19, at block 114, the source/drain features 240 are epitaxially and selectively formed from surfaces of the channel extension features 236 (including the bottom channel extension features 236B). In FIG. 19, the channel extension features 236 may substantially cover exposed surfaces of the channel layers 208 and exposed portions of the substrate 202. Sidewalls of the sacrificial layers 206 remain covered by the inner spacer features 234. Suitable epitaxial processes for block 114 include vapor-phase epitaxy (VPE), ultra-high vacuum CVD (UHV-CVD), molecular beam epitaxy (MBE), and/or other suitable processes. The epitaxial growth process at block 114 may use gaseous precursors, which interact with surfaces of the channel extension features 236. In some embodiments, parameters of the epitaxial growth process at block 114 are selected such that the source/drain features 240 are not epitaxially deposited on the inner spacer features 234. As similarly described above, each of the source/drain features 240 may include multiple epitaxial layers with different dopant concentration or germanium (Ge) content (if germanium (Ge) is desired), the source/drain features 240 may be n-type or p-type, and an anneal process may be performed to anneal the source/drain features 240. As shown in FIG. 19, when viewed along the Y direction, the source/drain feature 240 wraps over surfaces of the channel extension features 236 other than the one interfacing the channel layers 208. Put differently, the channel extension features 236 extend laterally into the source/drain features 240.

Subsequent to the formation of the source/drain features 240, similar operations at blocks 116, 118, and 120 may be performed to the workpiece 200 to form the second transistor 2000B shown in FIG. 21. At block 116, a CESL 242 and an ILD layer 244 are sequentially deposited over the workpiece 200 and the workpiece 200 is planarized to expose the dummy gate stack 220. After the dummy gate stack 220 is removed, the channel layers 208 in the channel regions 212C are released to form channel members 2080 after the sacrificial layers 206 are selectively removed. After the channel members 2080 are formed, a gate structure 250 (shown in FIG. 21) is formed to wrap around each of the channel members 2080. Operations at blocks 116, 118 and 120 have been described in detail above and details thereof will not be repeated here for brevity.

As shown in FIG. 21, the second transistor 2000B may include the same first top gate length TGL1, the same first gate length GL1, a second channel length CL2 greater than the first channel length CL1. The formation of the channel extension features 236 does not affect dimensions of the gate structure 250, including the gate length. As shown in FIG. 21, when each of the channel extension features 236 has an extension amount E along the X direction, the second channel length CL2 exceeds the first channel length CL1 by about 2 times of the extension amount E. The second transistor 2000B includes a second source/drain width (SDW2). Due to the formation of the channel extension features 236, the second source/drain width (SDW2) at the channel extension features 236 is smaller than the first source/drain width (SDW1) shown in FIG. 14.

Figure 22:
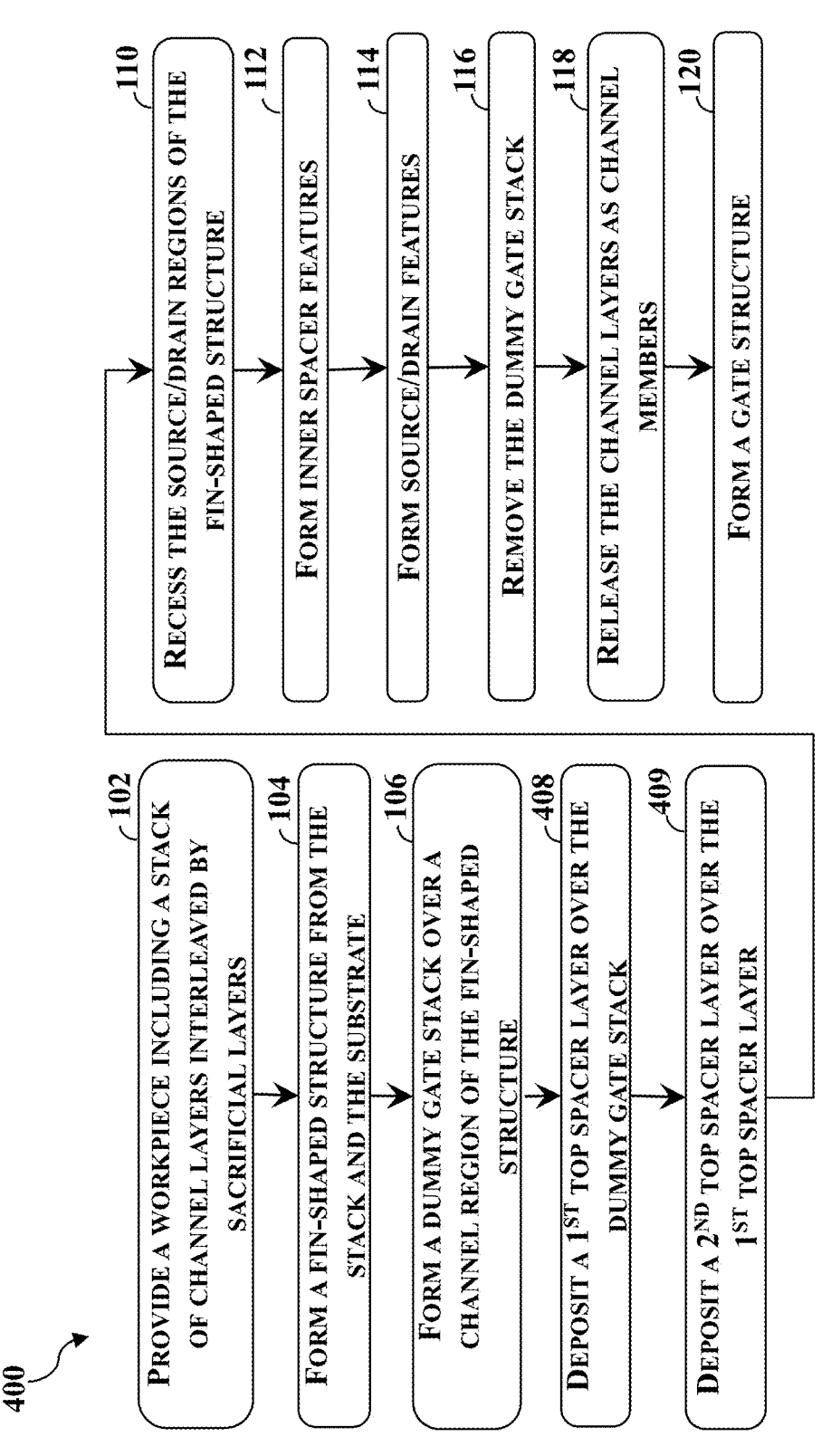
FIG. 22 illustrates a flowchart of a method for forming a semiconductor device with an extended channel length, according to one or more aspects of the present disclosure.
Figure 29:
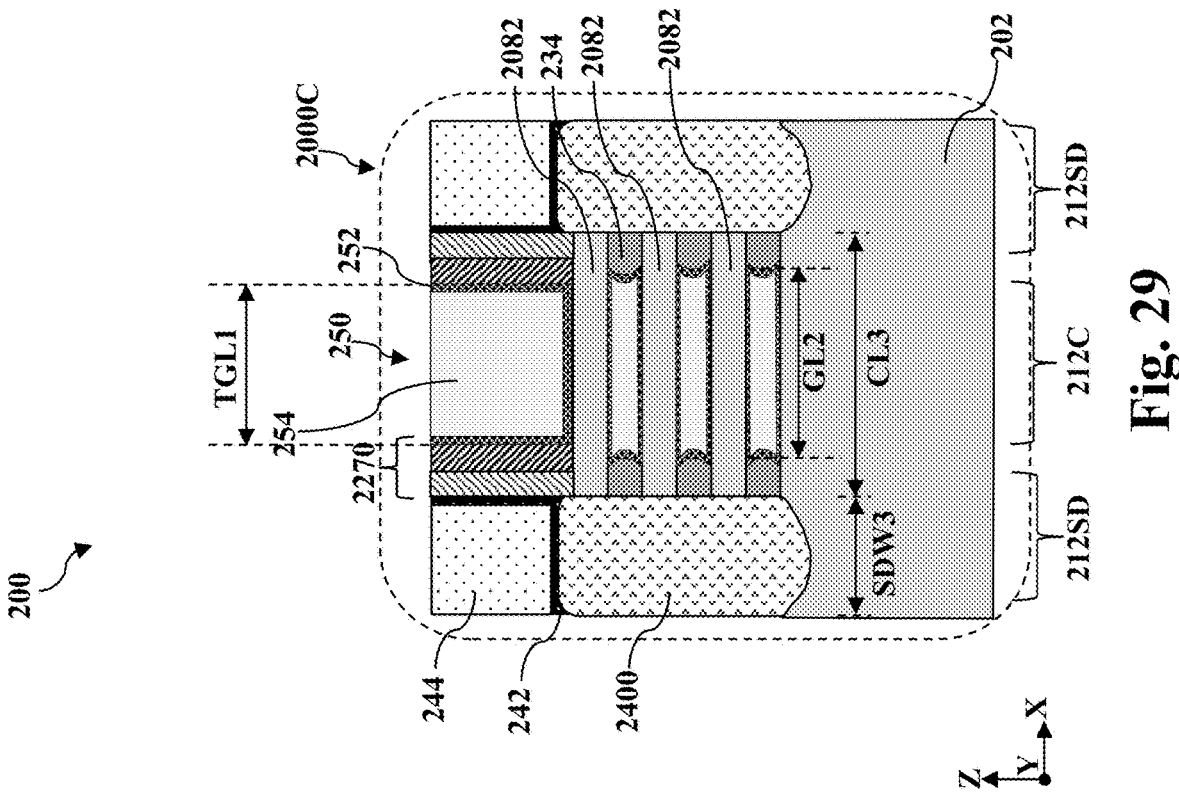

FIG. 22 illustrates a method 400 for forming a third transistor 2000C shown in FIG. 29. Compared to the first transistor 2000A shown in FIG. 14, the third transistor 2000C has longer channel lengths and smaller source/drain feature widths, which may lead to higher resistance, lower capacitance, and lower leakage current. As shown in FIGS. 1 and 22, method 400 shares operations in blocks 102-106 and 110-120 and further includes blocks 408 and 409.

Figure 23:
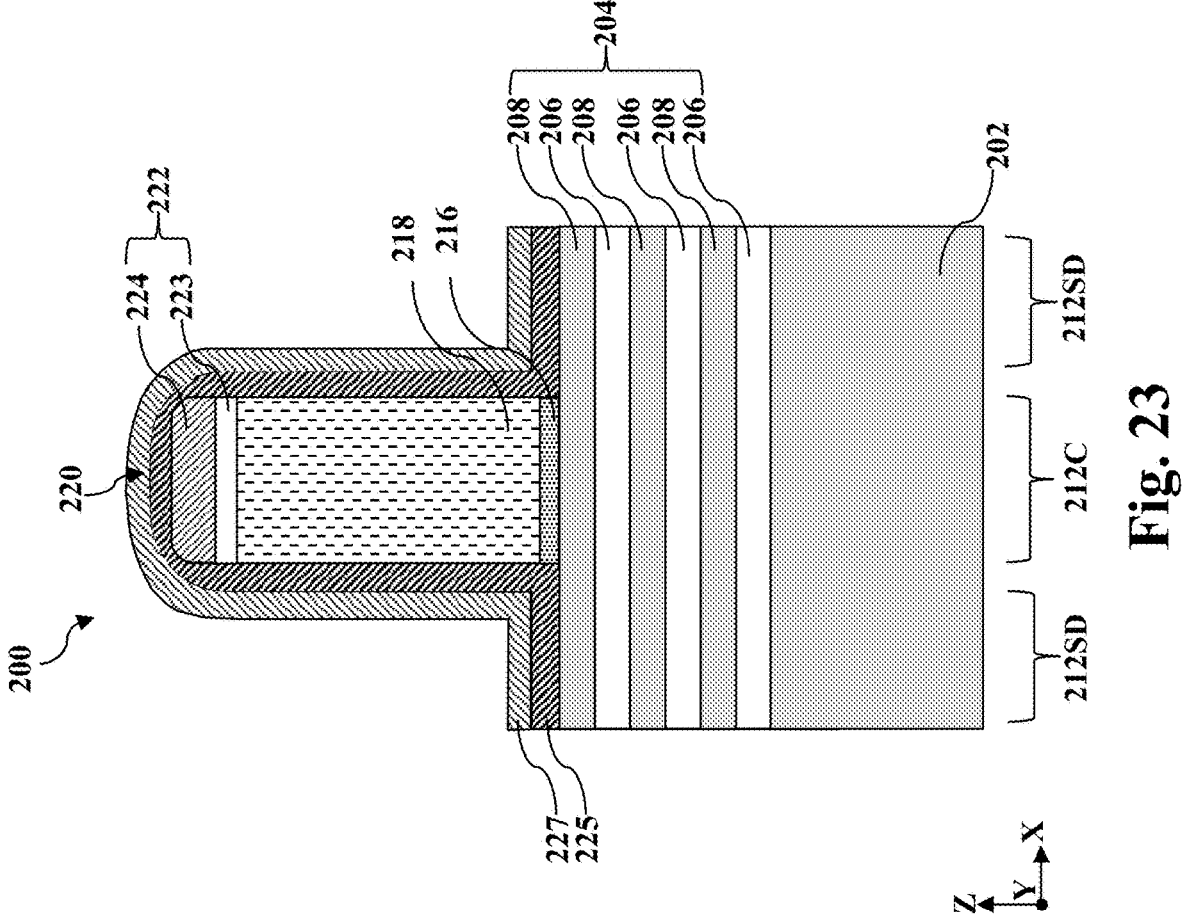
FIGS. 23-29 illustrate fragmentary cross-sectional views of a workpiece during a fabrication process according to the method of FIG. 22, according to one or more aspects of the present disclosure.

Referring to FIGS. 22 and 23, method 400 includes a block 408 where a first top spacer layer 225 is deposited over the dummy gate stack 220. The first top spacer layer 225 is deposited conformally over the workpiece 200, including over top surfaces and sidewalls of the dummy gate stack 220. The term "conformally" may be used herein for ease of description of a layer having substantially uniform thickness over various regions. The first top spacer layer 225 may share the same composition and thickness of the top spacer layer 226 described above with respect to method 100. In fact, in some embodiments, the first top spacer layer 225 may be the same as the top spacer layer 226 and no areas of the workpiece 200 is masked off at block 408. In some other embodiments where the first top spacer layer 225 and the top spacer layer 226 have different compositions, areas not receiving the first top spacer layer 225 may be masked off using processes described above in conjunction with FIGS. 15 and 16. In some embodiments, the first top spacer layer 225 may include silicon carbonitride, silicon oxycarbide, silicon oxycarbonitride, or silicon nitride. In some implementations, the first top spacer layer 225 may be deposited over the dummy gate stack 220 using processes such as, a CVD process, a subatmospheric CVD (SACVD) process, an ALD process, or other suitable process.

Referring to FIGS. 22 and 23, method 400 includes a block 409 where a second top spacer layer 227 is deposited over the first top spacer layer 225. The second top spacer layer 227 is deposited conformally over the first top spacer layer 225. The second top spacer layer 227 may share the same composition and thickness of the top spacer layer 226 described above with respect to method 100. In some embodiments represented in FIG. 23, the second top spacer layer 227 may serve as a thickness booster to increase the overall thickness of the top spacer layers. For example, when each of the first top spacer layer 225 and the second top spacer layer 227 has the same thickness as the top spacer layer 226, the overall thickness of the first top spacer layer 225 and the second top spacer layer 227 may be twice of the thickness of the top spacer layer 226 shown in FIG. 6. In some embodiments, the second top spacer layer 227 may also include silicon carbonitride, silicon oxycarbide, silicon oxycarbonitride, or silicon nitride and may be deposited over the dummy gate stack 220 using processes such as, a CVD process, a subatmospheric CVD (SACVD) process, an ALD process, or other suitable process.

Figure 24:
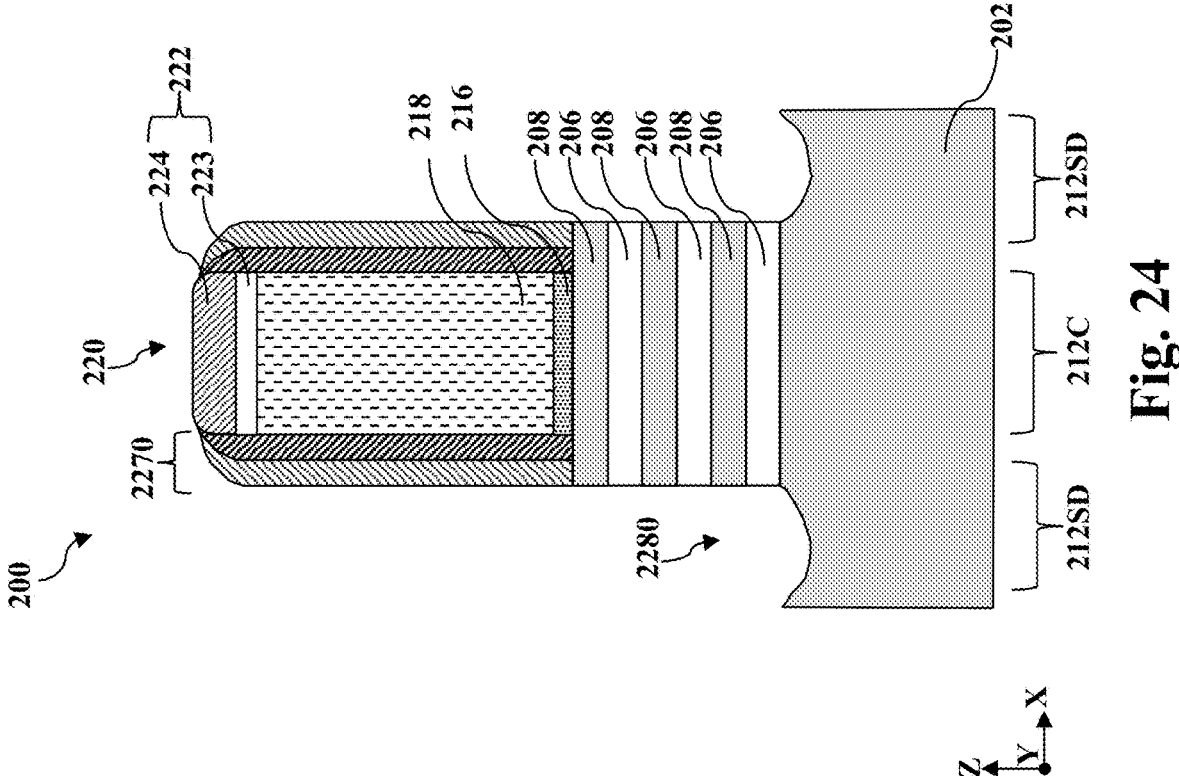
Figure 25:
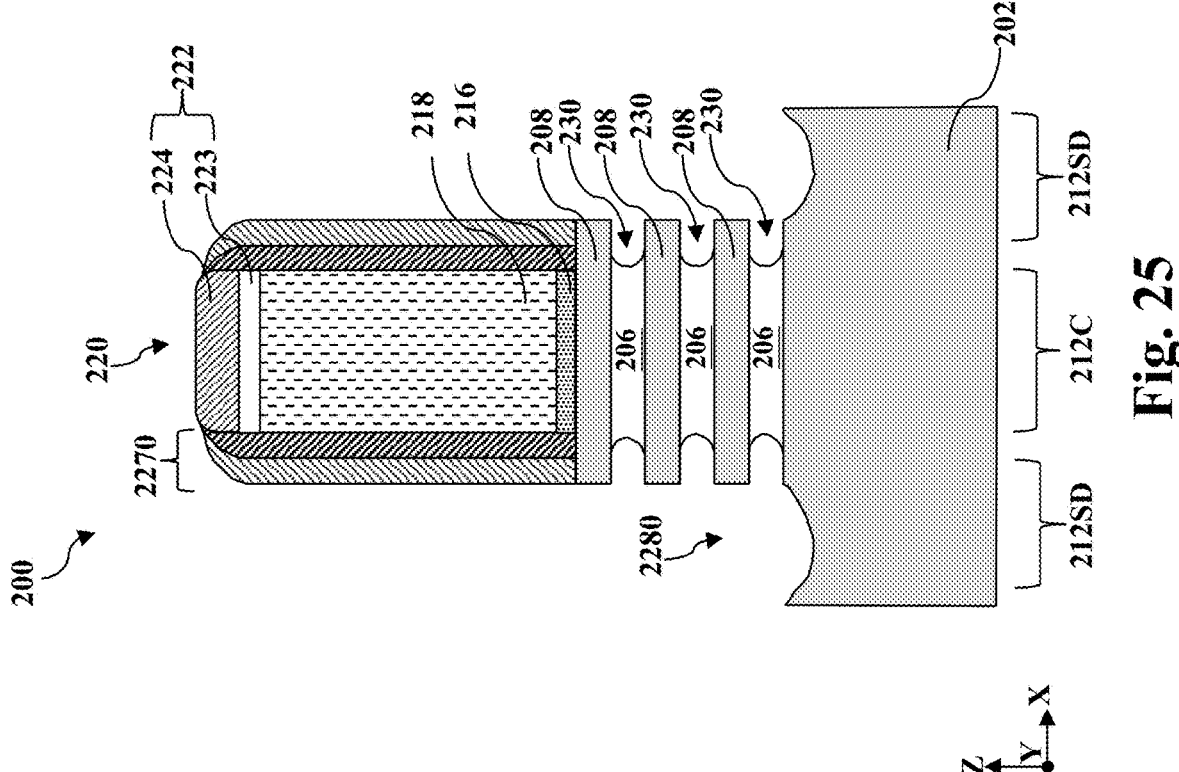
Figure 26:
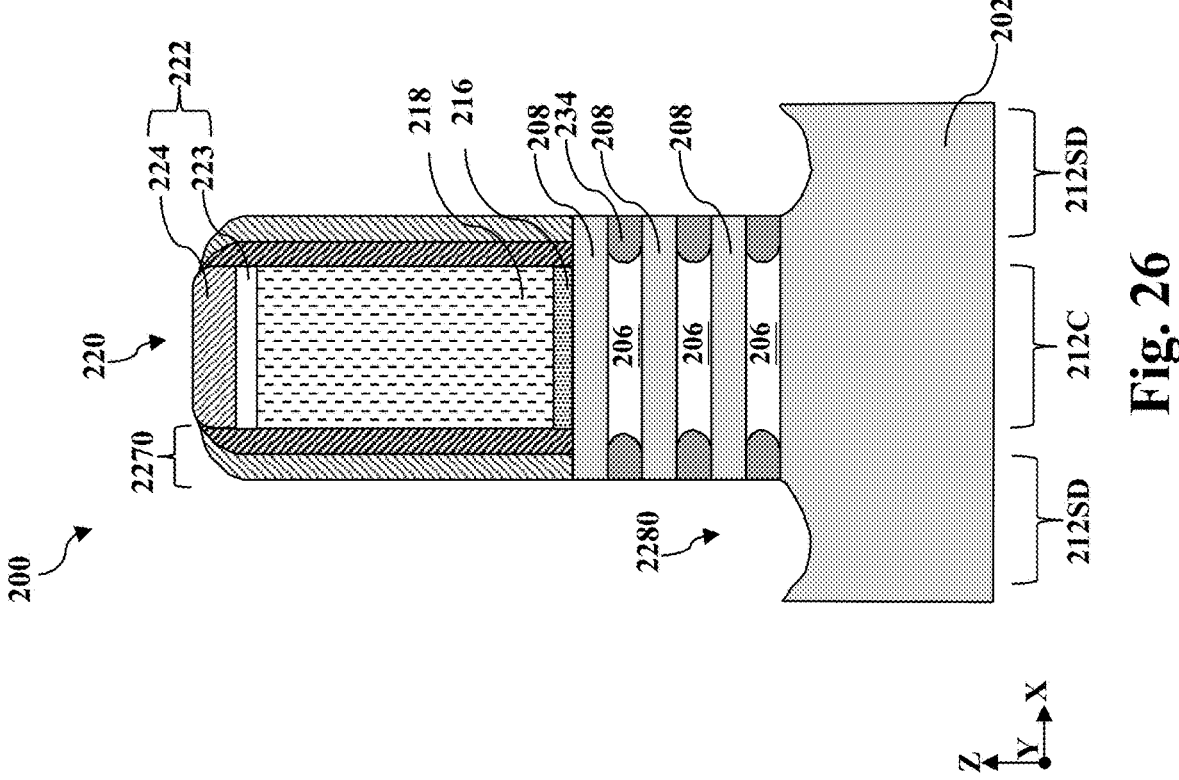
Figure 27:
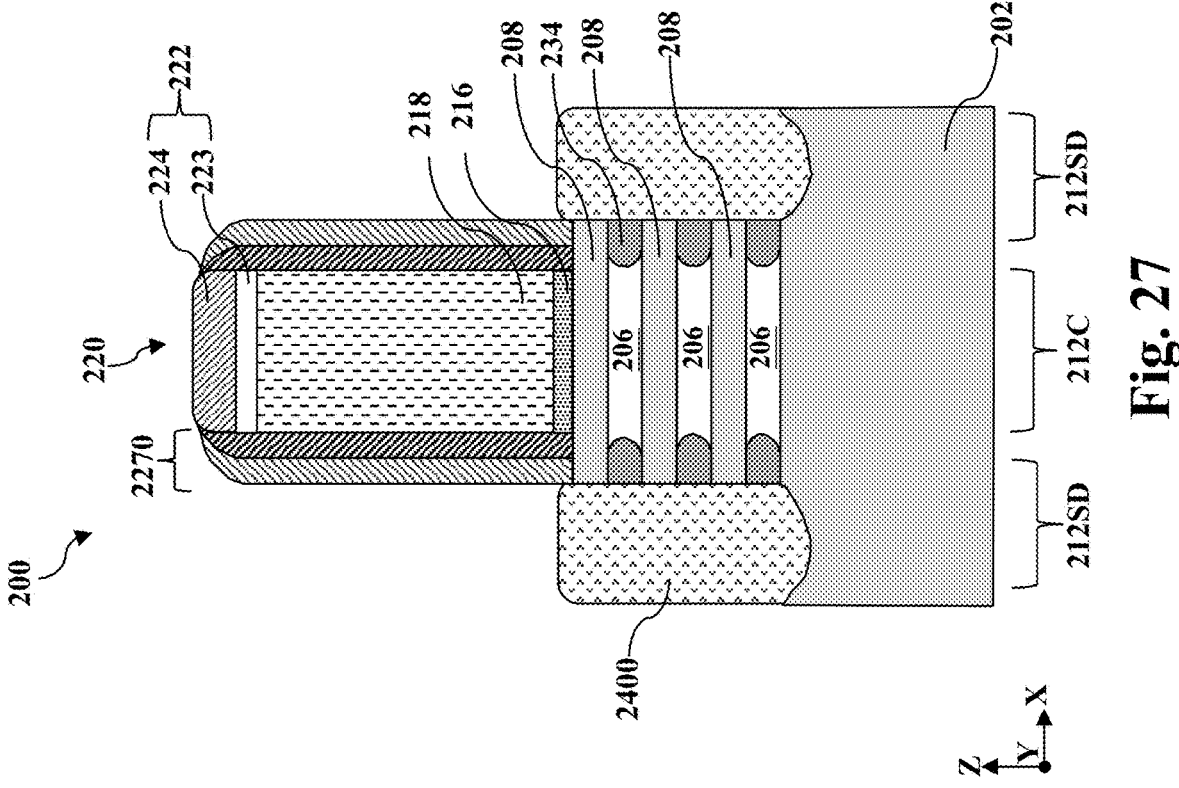

Referring to FIGS. 22 and 24, after the deposition of the second top spacer layer 227, method 400 proceeds to block 110 where source/drain regions 212SD of the fin-shaped structure 212 are recessed to form narrow source/drain trenches 2280. As shown in FIG. 24, the recessing at block 110 may remove the top facing portions of the first top spacer layer 225 and the second top spacer layer 227 to form a thick top spacer 2270 disposed along sidewalls of the dummy gate stack 220. In some embodiments, the source/drain regions 212SD that are not covered by the dummy gate stack 220 are etched by a dry etch or a suitable etching process to form the narrow source/drain trenches 2280. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIG. 24, the source/drain regions 212SD of the fin-shaped structure 212 are recessed to expose sidewalls of the sacrificial layers 206 and the channel layers 208. In some implementations, the narrow source/drain trenches 2280 extend below the stack 204 into the substrate 202. Because of the boosted thickness of the thick top spacer 2270, along the X direction, each of the narrow source/drain trenches 2280 in FIG. 24 is narrower than the source/drain trenches 228 in FIG. 7.

Figure 28:
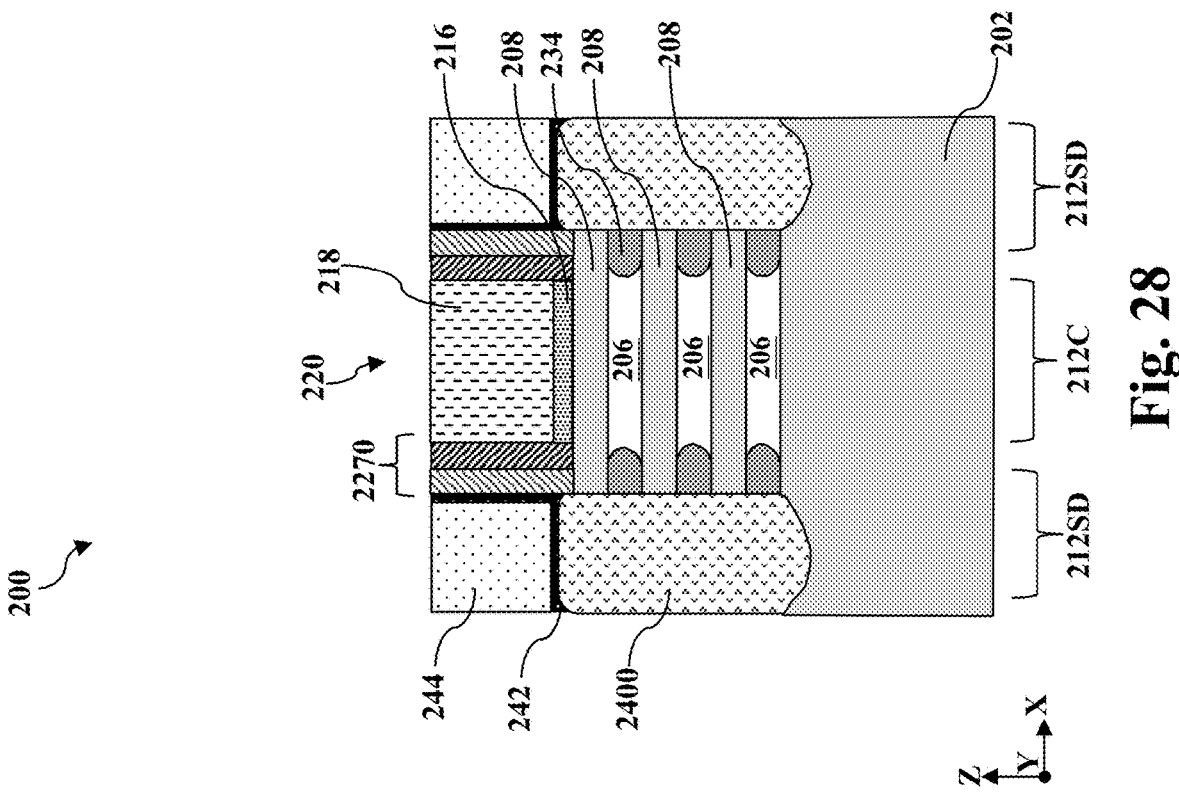

Subsequent to the formation of the narrow source/drain trenches 2280, similar operations at blocks 112, 114, 116, 118, and 120 may be performed to the workpiece 200 to form the third transistor 2000C shown in FIG. 29. At block 112, inner spacer features 234 are formed to interleave the channel layers 208. At block 114, narrow source/drain features 2400 are formed in the narrow source/drain trenches 2280. At block 116, a CESL 242 and an ILD layer 244 are sequentially deposited over the workpiece 200 and the workpiece 200 is planarized to expose the dummy gate stack 220, as shown in FIG. 28. After the dummy gate stack 220 is removed, the channel layers 208 in the channel regions 212C are released to form channel members 2080 after the sacrificial layers 206 are selectively removed. After the channel members 2080 are formed, a gate structure 250 (shown in FIG. 29) is formed to wrap around each of the channel members 2080. An upper portion of the gate structure 250 is sandwiched between a pair of thick top spacers 2270 and a lower portion of the gate structure 250 is isolated from the source/drain features 2400 by the plurality of inner spacer features 234. Operations at blocks 112, 114, 116, 118 and 120 have been described in detail above and details thereof will not be repeated here for brevity.

As shown in FIG. 29, the third transistor 2000C may include the same first top gate length TGL1, a second gate length GL2, a third channel length CL3 greater than the first channel length CL1, and a third source/drain feature width (SDW3) smaller than the first source/drain feature width (SDW1). Because the X-direction dimension of the dummy gate stack 220 remains unchanged, the boosted thickness of the thick top spacer 2270 leads to a greater third channel length CL3. Because thicknesses of the inner spacer features 234 are substantially the same, the third channel length CL3 is also increased, likely by the thickness of the second top spacer layer 227.

Figure 33:
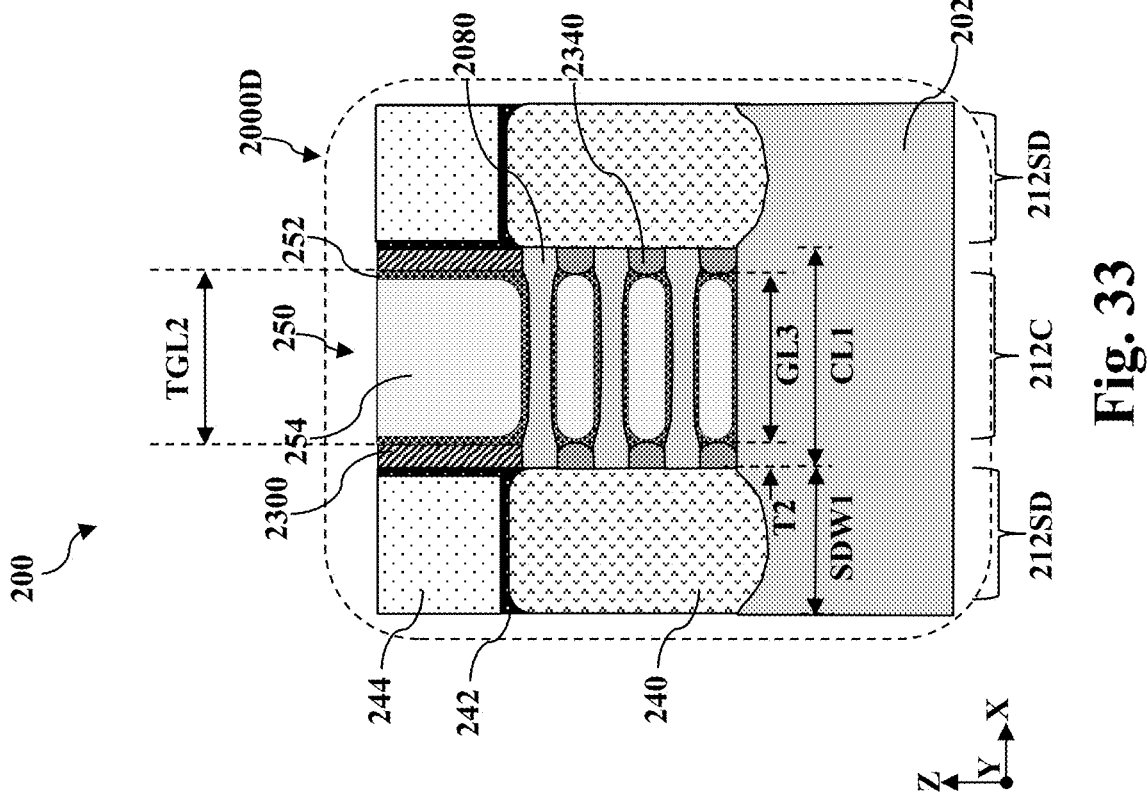

FIG. 30 illustrates a method 500 for forming a fourth transistor 2000D shown in FIG. 33. Compared to the first transistor 2000A shown in FIG. 14, the fourth transistor 2000D has longer gate lengths, the same source/drain feature widths and the same channel lengths, which may lead to higher resistance, lower capacitance, and lower leakage current. As shown in FIGS. 1 and 30, method 500 shares operations in blocks 102-118 and 120 and further includes block 519.

Figure 31:
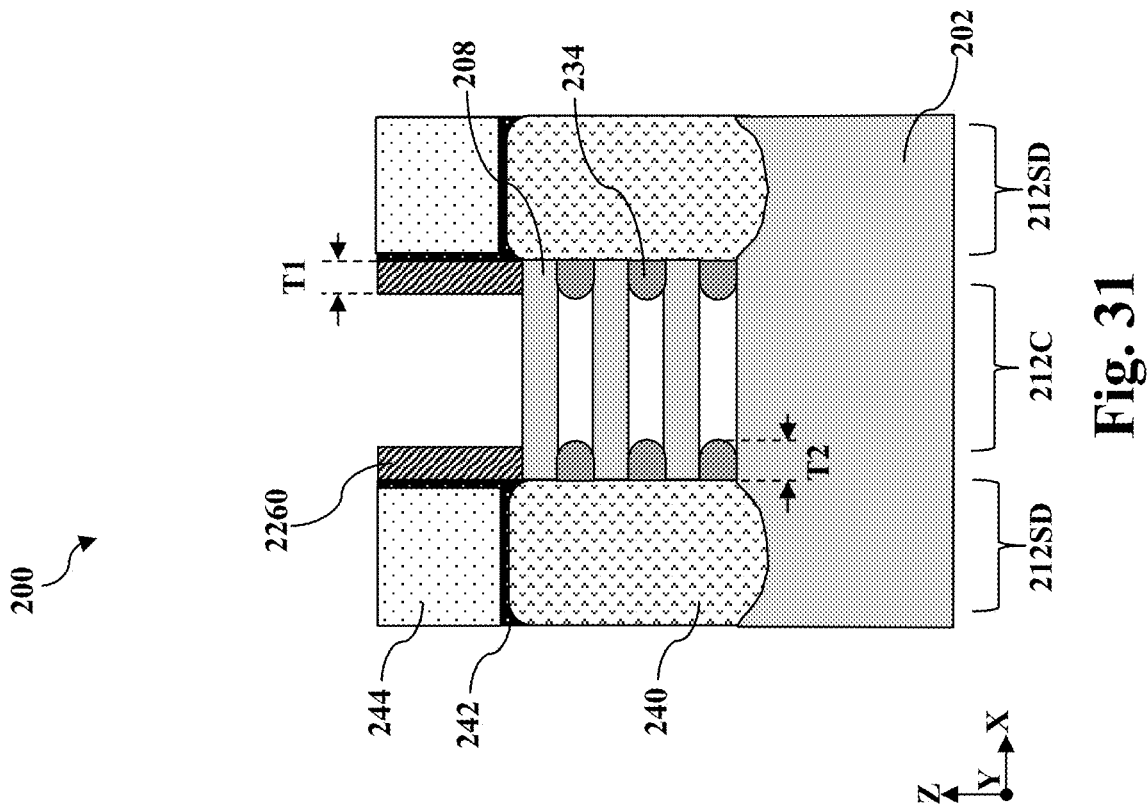
FIGS. 31-33 illustrate fragmentary cross-sectional views of a workpiece during a fabrication process according to the method of FIG. 30, according to one or more aspects of the present disclosure.
Figure 32:
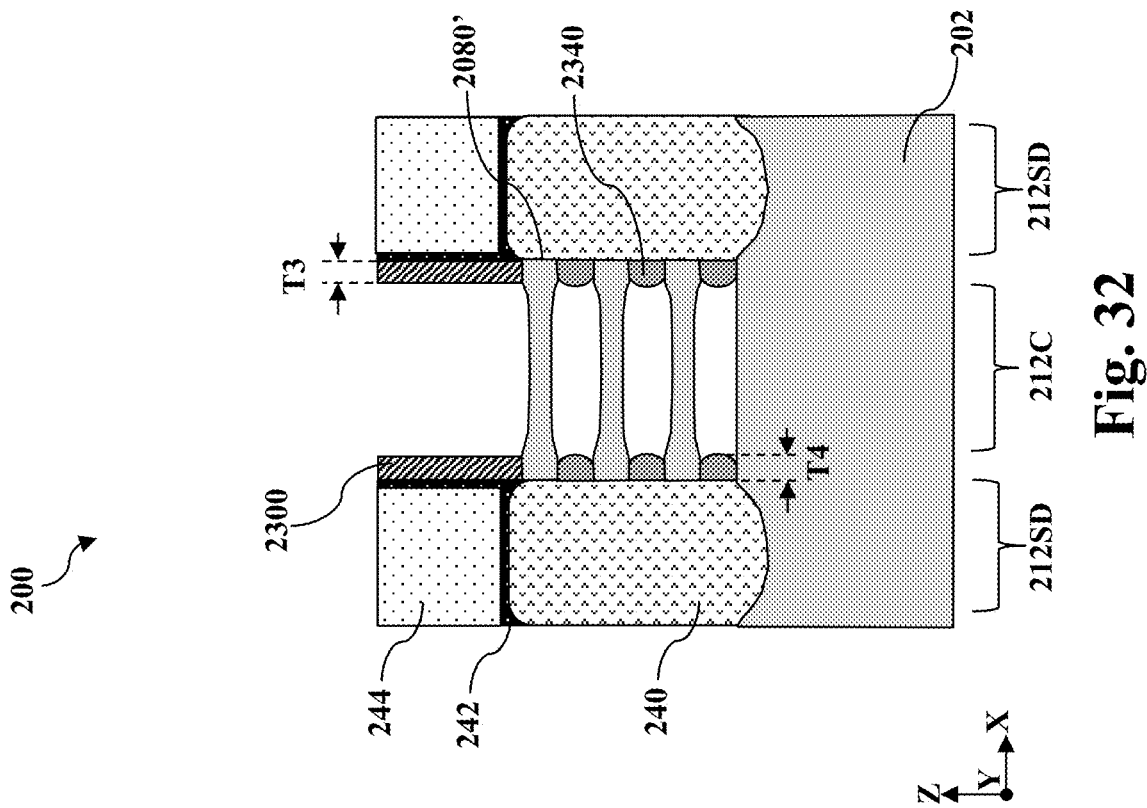

Referring to FIGS. 30, 31 and 32, method 500 includes a block 519 wherein the top spacer 2260 and the inner spacer features 234 are trimmed. After method 500 progresses through blocks 102-118 to release the channel layers 208 as channel members 2080 over the channel region 212C, sidewalls of the top spacer 2260 and the inner spacer features 234 are exposed in the channel region 212C. At block 519, the top spacer 2260 and the inner spacer features 234 are selectively trimmed without substantially etching the channel members 2080. In some embodiments, an isotropic wet etch process may be used to trim the top spacer 2260 and the inner spacer features 234. An example isotropic wet etch process may include use of vapor of hydrogen fluoride (HF). As shown in FIG. 32, the trimming results in a thin top spacer 2300, thin inner spacer features 2340, and thin channel members 2080'. While the channel members 2080 may be slightly etched during their release from the sacrificial layers 206, the trimming at block 519 further trims and etches the channel members 2080 to form the thin channel members 2080'. In some embodiments, along the X direction, the top spacers 2260 include a first thickness T1 and the inner spacer features 234 include a second thickness (T2). The thin top spacers 2300 include a third thickness T3 and the thin inner spacer features 2340 include a fourth thickness (T4). In some embodiments, a ratio of the third thickness (T3) to the first thickness (T1) may be between about 0.5 and 0.85 and a ratio of the fourth thickness (T4) to the second thickness (T2) may be between about 0.5 and 0.85.

Subsequent to the trimming of the top spacer 2260 and the inner spacer features 234, similar operations at block 120 may be performed to the workpiece 200 to form the fourth transistor 2000D shown in FIG. 33. At block 120, a gate structure 250 is formed to wrap around each of the thin channel members 2080'. An upper portion of the gate structure 250 is sandwiched between a pair of thin top spacers 2300 and a lower portion of the gate structure 250 is isolated from the source/drain features 240 by the plurality of thin inner spacer features 2340. Operations at block 120 have been described in detail above and details thereof will not be repeated here for brevity.

As shown in FIG. 33, the fourth transistor 2000D may include a second top gate length TGL2 greater than the first top gate length TGL1, a third gate length GL3 greater than the first gate length GL1, the same first channel length CL1, and the same first source/drain feature width (SDW1). Without pushing the channel-source/drain boundary towards the source/drain regions, the trimming widens the gate trench and increases the top gate length to the second top gate length TGL2 and the gate length to the third gate length GL3. The increase to the second top gate length TGL2 and the third gate length GL3 is achieved at no expense to the first channel length CL1 and the first source/drain feature width (SDW1).

Figure 34:
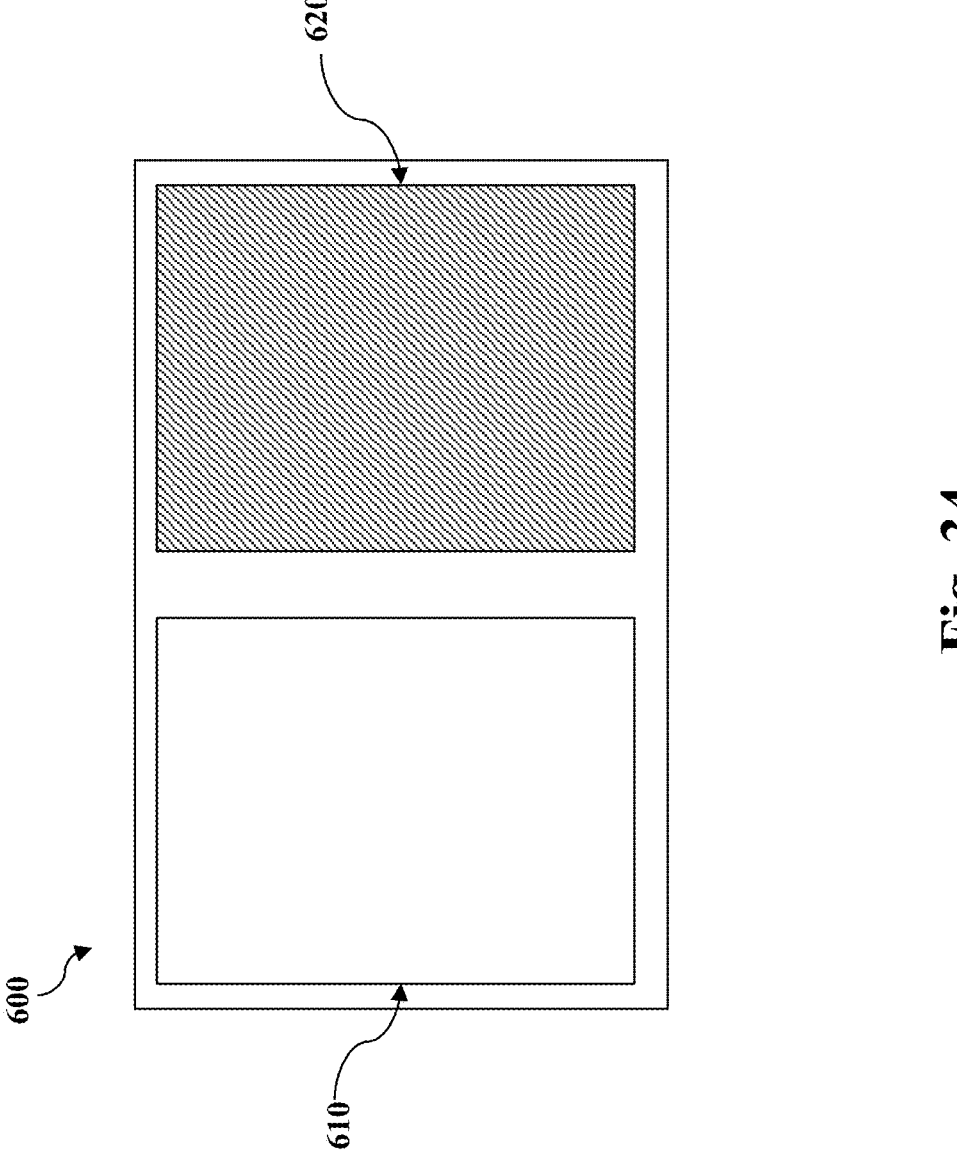
FIG. 34 is a schematic top view of a circuit device that includes more than one type of transistors, according to one or more aspects of the present disclosure.
Figure 35:
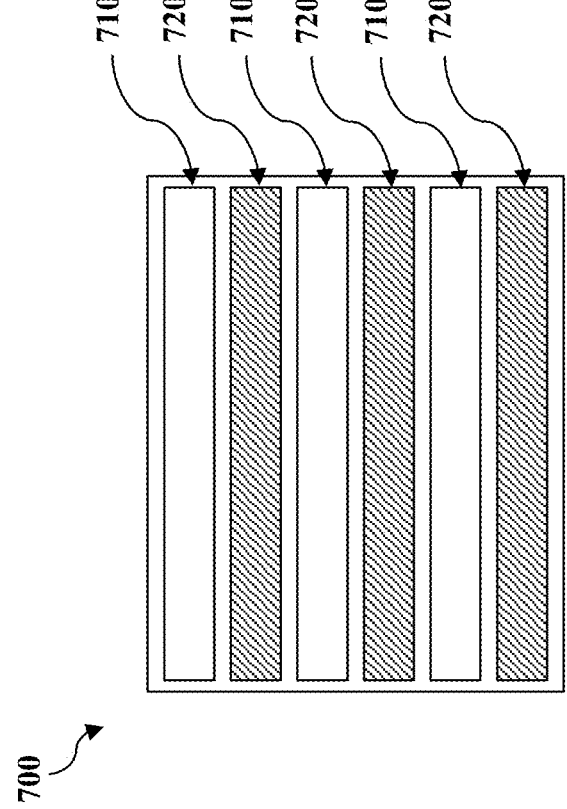
FIG. 35 is a schematic top view of a standard cell that includes more than one type of transistors, according to one or more aspects of the present disclosure.

Methods of the present disclosure may be used to form different types of devices in a circuit device or in a standard cell. FIG. 34 illustrates a circuit device 600 that includes a first macro 610 and a second macro 620. In some embodiments, transistors in the first macro 610 and the second macro 620 are different. For example, all transistors in the first macro 610 may be the first transistors 2000A in FIG. 14 and all transistors in the second macro 620 may be the second transistors 2000B in FIG. 21, the third transistors 2000C in FIG. 29, or the fourth transistors 2000D in FIG. 33. FIG. 35 illustrates a standard cell 700 that include first arrays 710 of transistors and second arrays 720 of transistors. In some embodiments, transistors in the first arrays 710 and the second arrays 720 are different. For example, all transistors in the first arrays 710 may be the first transistors 2000A in FIG. 14 and all transistors in the second arrays 720 may be the second transistors 2000B in FIG. 21, the third transistors 2000C in FIG. 29, or the fourth transistors 2000D in FIG. 33. In some embodiments, each of the first transistor 2000A, the second transistor 2000B, the third transistor 2000C, and the fourth transistor 2000D has the same footprint and the same gate-to-gate pitch (i.e., gate pitch), which makes incorporation of different types of transistors in a single circuit device or standard cell more straightforward.

In one exemplary aspect, the present disclosure is directed to a method. The method includes receiving a workpiece that includes an active region over a substrate and having a plurality of first semiconductor layers interleaved by a plurality of second semiconductor layers, and a dummy gate stack over a channel region of the active region, etching source/drain regions of the active region to form source/drain trenches that expose sidewalls of the active region, selectively and partially etching the plurality of second semiconductor layers to form inner spacer recesses, forming inner spacer features in the inner spacer recesses, forming channel extension features on exposed sidewalls of the plurality of first semiconductor layers, after the forming of the channel extension features, forming source/drain features over the source/drain trenches, removing the dummy gate stack, selectively removing the plurality of second semiconductor layers to form a plurality of nanostructures in the channel region, and forming a gate structure to wrap around each of the plurality of nanostructures. The channel extension features include undoped silicon.

In some embodiments, the forming of the channel extension features is selective to surfaces of semiconductor materials. In some implementations, after the forming of the source/drain features, the channel extension features extend laterally into the source/drain features. In some embodiments, the source/drain trenches expose portions of the substrate and the forming of the channel extension features also forms a bottom semiconductor layer on the exposed portions of the substrate. In some instances, the plurality of first semiconductor layers include silicon and the plurality of second semiconductor layers include silicon germanium.

In another exemplary aspect, the present disclosure is directed to a semiconductor structure. The semiconductor structure includes a substrate and a first transistor and a second transistor disposed over the substrate. The first transistor includes a first source/drain feature and a second source/drain feature, a first plurality of channel members extending between the first source/drain feature and the second source/drain feature along a direction, a first gate structure wrapping around each of the first plurality of channel members, and a first pair of gate spacer layers disposed over the first plurality of channel members and sandwiching a top portion of the first gate structure. The second transistor includes a third source/drain feature and a fourth source/drain feature, a second plurality of channel members extending between the third source/drain feature and the fourth source/drain feature along the direction, a second gate structure wrapping around each of the second plurality of channel members, and a second pair of gate spacer layers disposed over the second plurality of channel members and sandwiching a top portion of the second gate structure. Along the direction, a thickness of each of the second pair of gate spacer layers is smaller than a thickness of each of the first pair of gate spacer layers.

In some embodiments, the top portion of the first gate structure includes a first gate length along the direction, the top portion of the second gate structure includes a second gate length along the direction, and the second gate length is greater than the first gate length. In some embodiments, the first transistor further includes first inner spacer features interleaving the first plurality of channel members, the second transistor further includes second inner spacer features interleaving the second plurality of channel members, and along the direction, a thickness of each of the second inner spacer features is smaller than a thickness of each of the first inner spacer features. In some embodiments, the first plurality of channel members include a first channel length, the second plurality of channel members include a second channel length, and the first channel length is substantially the same as the second channel length. In some instances, each of the first source/drain feature and the second source/drain feature includes a first width along the direction, each of the third source/drain feature and the fourth source/drain feature includes a second width along the direction, and the first width is substantially the same as the second width. In some embodiments, the first plurality of channel members include silicon. In some instances, the first transistor and the second transistor have a same footprint.

In yet another exemplary aspect, the present disclosure is directed to a method. The method includes receiving a workpiece that includes a substrate having a first area and a second area, a first active region over the first area and including a plurality of first semiconductor layers interleaved by a plurality of second semiconductor layers, the first active region extending between a first source/drain feature and a second source/drain feature, a second active region over the second area and having the plurality of first semiconductor layers interleaved by the plurality of second semiconductor layers, the second active region extending between a third source/drain feature and a fourth source/drain feature, a first dummy gate stack over a channel region of the first active region, a first pair of gate spacer layers disposed over the first active region and sandwiching a top portion of the first dummy gate stack, a second dummy gate stack over a channel region of the second active region, and a second pair of gate spacer layers disposed over the second active region and sandwiching a top portion of the second dummy gate stack, removing the first dummy gate stack and the second dummy gate stack, selectively removing the plurality of second semiconductor layers to form a first plurality of nanostructures in the first area and a second plurality of nanostructures in the second area, selectively trimming the first pair of gate spacer layers and the second pair of gate spacer layers in the second area, and after the trimming, forming a first gate structure to wrap around each of the first plurality of nanostructures and a second gate structure to wrap around each of the second plurality of nanostructures.

In some embodiments, the workpiece further includes, first inner spacer features interleaving the plurality of first semiconductor layers in the first area and second inner spacer features interleaving the plurality of first semiconductor layers in the second area. In some embodiments, the selectively trimming further includes trimming the second inner spacer features. In some implementations, the selectively trimming etches dielectric materials faster than it etches semiconductor materials. In some embodiments, the first inner spacer features and the second inner spacer features include silicon oxycarbonitride, silicon oxynitride, silicon carbonitride, or silicon oxycarbide. In some embodiments, the selectively trimming includes blanketly depositing a mask layer over the first area and the second area, and patterning the mask layer to form a patterned mask layer over the first area while the second area is exposed. In some instances, the mask layer includes aluminum oxide. In some embodiments, the plurality of first semiconductor layers include silicon and the plurality of second semiconductor layers include silicon oxide.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      an active region over a substrate and comprising a plurality of first semiconductor layers interleaved by a plurality of second semiconductor layers, and
      a dummy gate stack over a channel region of the active region, etching source/drain regions of the active region to form source/drain trenches that expose sidewalls of the active region;
   selectively and partially etching the plurality of second semiconductor layers to form inner spacer recesses;
   forming inner spacer features in the inner spacer recesses;
   forming channel extension features on exposed sidewalls of the plurality of first semiconductor layers;
   after the forming of the channel extension features, forming source/drain features over the source/drain trenches;
   removing the dummy gate stack;
   selectively removing the plurality of second semiconductor layers to form a plurality of nanostructures in the channel region; and
   forming a gate structure to wrap around each of the plurality of nanostructures,
   wherein the channel extension features comprise undoped silicon.

2. The method of claim 1, wherein the forming of the channel extension features is selective to surfaces of semiconductor materials.

3. The method of claim 1, wherein, after the forming of the source/drain features, the channel extension features extend laterally into the source/drain features.

4. The method of claim 1,
   wherein the source/drain trenches expose portions of the substrate,
   wherein the forming of the channel extension features also forms a bottom semiconductor layer on the exposed portions of the substrate.

5. The method of claim 1, wherein the plurality of first semiconductor layers comprise silicon and the plurality of second semiconductor layers comprise silicon germanium.

6. A semiconductor structure, comprising:
   a substrate; and
   a first transistor and a second transistor disposed over the substrate,
   wherein the first transistor comprises:
      a first source/drain feature and a second source/drain feature,
      a first plurality of channel members extending between the first source/drain feature and the second source/drain feature along a direction,
      a first gate structure wrapping around each of the first plurality of channel members, and
      a first pair of gate spacer layers disposed over the first plurality of channel members and sandwiching a top portion of the first gate structure, wherein the second transistor comprises:

a third source/drain feature and a fourth source/drain feature, a second plurality of channel members extending between the third source/drain feature and the fourth source/drain feature along the direction, a second gate structure wrapping around each of the second plurality of channel members, and a second pair of gate spacer layers disposed over the second plurality of channel members and sandwiching a top portion of the second gate structure, wherein, along the direction, a thickness of each of the second pair of gate spacer layers is smaller than a thickness of each of the first pair of gate spacer layers.

7. A method, comprising:

receiving a workpiece comprising:

a substrate comprising a first area and a second area, a first active region over the first area and comprising a plurality of first semiconductor layers interleaved by a plurality of second semiconductor layers, the first active region extending between a first source/drain feature and a second source/drain feature, a second active region over the second area and comprising the plurality of first semiconductor layers interleaved by the plurality of second semiconductor layers, the second active region extending between a third source/drain feature and a fourth source/drain feature, a first dummy gate stack over a channel region of the first active region, a first pair of gate spacer layers disposed over the first active region and sandwiching a top portion of the first dummy gate stack, a second dummy gate stack over a channel region of the second active region, and a second pair of gate spacer layers disposed over the second active region and sandwiching a top portion of the second dummy gate stack;

removing the first dummy gate stack and the second dummy gate stack;

selectively removing the plurality of second semiconductor layers to form a first plurality of nanostructures in the first area and a second plurality of nanostructures in the second area;

selectively trimming the first pair of gate spacer layers and the second pair of gate spacer layers in the second area; and after the trimming, forming a first gate structure to wrap around each of the first plurality of nanostructures and a second gate structure to wrap around each of the second plurality of nanostructures.

8. The method of claim 7, wherein the workpiece further comprises, first inner spacer features interleaving the plurality of first semiconductor layers in the first area and second inner spacer features interleaving the plurality of first semiconductor layers in the second area.

9. The method of claim 8, wherein the selectively trimming further comprises trimming the second inner spacer features.

10. The method of claim 8, wherein the selectively trimming etches dielectric materials faster than it etches semiconductor materials.

11. The method of claim 8, wherein the first inner spacer features and the second inner spacer features comprise silicon oxycarbonitride, silicon oxynitride, silicon carbonitride, or silicon oxycarbide.

12. The method of claim 11, wherein the plurality of first semiconductor layers comprise silicon and the plurality of second semiconductor layers comprise silicon oxide.

13. The method of claim 7, wherein the selectively trimming comprises:

blanketly depositing a mask layer over the first area and the second area; and patterning the mask layer to form a patterned mask layer over the first area while the second area is exposed.

14. The method of claim 13, wherein the mask layer comprises aluminum oxide.

15. The semiconductor structure of claim 6, wherein the top portion of the first gate structure comprises a first gate length along the direction, wherein the top portion of the second gate structure comprises a second gate length along the direction, wherein the second gate length is greater than the first gate length.

16. The semiconductor structure of claim 6, wherein the first transistor further comprises first inner spacer features interleaving the first plurality of channel members, wherein the second transistor further comprises second inner spacer features interleaving the second plurality of channel members, wherein, along the direction, a thickness of each of the second inner spacer features is smaller than a thickness of each of the first inner spacer features.

17. The semiconductor structure of claim 6, wherein the first plurality of channel members comprise a first channel length, wherein the second plurality of channel members comprise a second channel length, wherein the first channel length is substantially the same as the second channel length.

18. The semiconductor structure of claim 6, wherein each of the first source/drain feature and the second source/drain feature comprises a first width along the direction, wherein each of the third source/drain feature and the fourth source/drain feature comprises a second width along the direction, wherein the first width is substantially the same as the second width.

19. The semiconductor structure of claim 6, wherein the first plurality of channel members comprise silicon.

20. The semiconductor structure of claim 6, wherein the first transistor and the second transistor comprise a same footprint.

* * * * *